(12) United States Patent
Almasmoom et al.

(10) Patent No.: US 12,503,922 B2
(45) Date of Patent: Dec. 23, 2025

(54) CONNECTION DEVICE FOR CASING STUBS

(71) Applicant: Saudi Arabian Oil Company, Dhahran (SA)

(72) Inventors: Salahaldeen Saleh Almasmoom, Dammam (SA); Mohammad Baqer Al-Ali, Al Khobar (SA); Faris Abdullah Al Qahtani, Buqayq (SA)

(73) Assignee: Saudi Arabian Oil Company, Dhahran (SA)

( * ) Notice: Subject to any disclaimer, the term of this patent is extended or adjusted under 35 U.S.C. 154(b) by 89 days.

(21) Appl. No.: 18/516,731

(22) Filed: Nov. 21, 2023

(65) Prior Publication Data

US 2025/0163763 A1 May 22, 2025

(51) Int. Cl.
*E21B 17/08* (2006.01)
*E21B 23/06* (2006.01)
*E21B 33/12* (2006.01)

(52) U.S. Cl.
CPC .............. *E21B 17/08* (2013.01); *E21B 23/06* (2013.01); *E21B 33/12* (2013.01)

(58) Field of Classification Search
CPC ...... E21B 43/10; E21B 33/12; E21B 33/1208; E21B 23/01; E21B 23/06; E21B 17/08
See application file for complete search history.

(56) References Cited

U.S. PATENT DOCUMENTS

| 4,116,044 A * | 9/1978 | Garrett ................ E21B 33/035 |
| | | 73/40.5 R |
| 10,081,998 B2 | 9/2018 | Tunget |
| 2017/0122082 A1* | 5/2017 | Lin ......................... B26D 3/16 |
| 2021/0270103 A1* | 9/2021 | Greci ..................... E21B 31/18 |
| 2022/0034186 A1* | 2/2022 | Sehsah .................. E21B 33/124 |
| 2022/0372839 A1 | 11/2022 | Almajed et al. |

FOREIGN PATENT DOCUMENTS

| CA | 2198163 | 12/2003 |
| EP | 1076757 B1 | 1/2003 |

* cited by examiner

*Primary Examiner* — Tara Schimpf
*Assistant Examiner* — Lamia Quaim
(74) *Attorney, Agent, or Firm* — Fish & Richardson P.C.

(57) ABSTRACT

A connection device includes an inverted polished bore housing for receiving a casing stub in a wellbore and a sealing assembly for connected the connection device to the casing stub. The inverted polished bore housing extends from an open first end of the connection device and includes a connection surface and a smooth inner surface. The connection surface is defines a first opening at the open first end of the connection device. The sealing assembly is arranged a second open end of the connection device, The sealing assembly has an expandable material connected to the inverted polished bore housing. The expandable material is configured to expand in the presence of an activation fluid.

23 Claims, 25 Drawing Sheets

CONNECTION DEVICE FOR CASING STUBS

TECHNICAL FIELD

This disclosure relates to system, assemblies, methods and devices for connecting replacement casings to a casing stub cemented in a wellbore.

BACKGROUND

Wellbore completion operations mount an inner casing to the walls of a wellbore or outer casing. In a long string cemented casing completion system ("long string system"), a unitary inner casing extends from the bottom of the wellbore extending all the way to the surface. A tubing hanger setting in a tubing spool lands and isolates an upper annular space outside the unitary inner casing from a lower annular space outside the unitary inner casing. The lower unitary inner casing is then cemented by pumping the cement through the entire long string and displacing the cement into the lower annular space between the inner casing and an out casing by flowing a fluid (e.g., drilling fluid or completion fluid (brine) with same mud weight through the entire inner casing. as the drilling fluid). High efficiency wiper plugs wipe the inner surface of the casing. The formed cement slab includes a column surrounding downhole portion of the unitary inner casing. Then, this completion system is pressure tested for leaks in the casing string before using the well over in future rigless operations.

In "upper and lower" completion systems ("upper/lower systems"), a lower inner is run through a wellbore and hung in an outer casing by a liner hanger. The lower inner casing is then cemented in place to the liner hanger depth. An upper liner casing is then run into the wellbore and sealed to the lower inner casing. The upper inner casing can include production tubing with production tubulars (e.g., production packer, or seals).

SUMMARY

In certain aspects, a connection device includes a body extending from an open first end of the connection device. The body includes a smooth inner surface and a connection surface. The inner surface at least partially defines an interior volume of the connection device. The connection surface defines a first opening at the open first end of the connection device. The connection device also includes a sealing assembly extending from a second open end of the connection device. The sealing assembly includes a cylindrical shell centered on an axis. The cylindrical shell has a first side facing the axis. The sealing assembly also includes a cylindrical, expandable material mounted on the first side of the cylindrical shell, wherein the expandable material is configured to expand radially towards the axis.

Some expandable materials have an expansion face oriented towards the axis, wherein the expansion face defines an opening in the second open end of the connection device. Some openings have an inner diameter, wherein the inner diameter can be greater than a diameter of the connection surface of the body. Some expansion faces can be configured to contact a surface and form a seal with the surface, wherein the seals have a pressure rating between 5000 psi and 15000 psi. Some openings have an inner diameter, and the inner diameter can be equal to a diameter of the connection surface of the body.

Some expandable materials expand in the presence of an activation fluid. Some activation fluids can be a water-based activation fluid or an oil-based activation fluid.

Some expandable materials include an elastomeric expandable materials. Some expansion face can be configured to contact a surface and form a seal with the surface. The seals may have a pressure rating between 5000 psi and 15000 psi.

The connection surface can be configured to attach to an inner casing.

The expandable material can be a first expandable material, and the sealing assembly can include a second expandable material mounted the shell of the sealing assembly. Some shells have a second side, opposite the first side, and the second sealing material can be mounted to the second side of the shell. The first expandable material and the second expandable material can be made of the same expandable material or different expandable materials. The first expandable material can be activated by a first activation fluid and the second expandable material can be activate by a second activation fluid. The first and second activation fluids can be different fluids or the same activation fluid.

The expandable material can be coated in a dissolvable coating.

The body may be an inverted polished bore housing.

Some surfaces of the body are at least partially formed by a material treated by a nitrating gas treatment.

The sealing assembly may be a first sealing assembly, and the device can further include a second sealing assembly. In some devices, a pup joint connects the second sealing assembly to the connection surface of the body. The second sealing assembly is a packer. The packer may be a production packer. The second sealing assembly can include a second shell centered on the axis, the second shell having an external side oriented away from the axis, and a second expandable material mounted to the external side of the shell. The first expandable material and the second expandable material may be made of the same expandable material or of different expandable materials. The first expandable material an be activated by a first activation fluid and the second expandable material can be activated by a second activation fluid. The first and second activation fluids may be different fluids or the same fluid. Some systems include a hanger sub-system attached to the connection surface of the body. The hanger sub-system may have a hanger, a second sealing assembly connected to the hanger, and a polished bore receptacle having a receiving chamber arranged between the second sealing assembly and the hanger. The second sealing assembly and the receiving chamber of the polished bore receptable can define a casing contact surface. The body may be an inverted polished bore housing. The second sealing assembly can include a packer housing and a second expandable material.

The connection device can have a length of at least 0.5 feet.

In certain aspects, a replacement assembly includes a connection device with an inverted polished bore housing (IPBH) and a sealing assembly. The IPBH extends from an open first end of the connection device. The inverted polished bore housing includes a connection surface defining a first opening at the open first end of the connection device, a smooth inner surface. The sealing assembly is arranged a second open end of the connection device. The sealing assembly includes an expandable material connected to the inverted polished bore housing and is configured to expand in the presence of an activation fluid. The replacement assembly also includes an inner casing connected to the inverted polished bore housing at the connection surface of the inverted polished bore housing.

Some inner casings have an inner diameter and some expandable materials have an expansion face defining an opening in the second end of the connection device. The diameter of the inner casing may be less than a diameter of the opening. The diameter of the inner casing can be equal to a diameter of the opening.

The connection surface of the inverted polished bore housing can have an inner diameter equal to or greater than the inner casing.

In some replacement assemblies, the connection surface of the inverted polished bore housing forms a first opening, and the sealing assembly forms a second opening. The inverted polished bore housing can have an inner surface and the inner surface can at least partially define an interior volume of the connection device. The interior volume of the connection device may extend from the first opening to the second opening. The interior volume of the connection device can be in fluid connection with the inner casing. The sealing assembly may be configured to isolate the interior volume of the connection device. The replacement assembly can be configured connect with a casing stub disposed in a wellbore.

Some replacement assemblies also include a second sealing assembly.

The connection device can further include a second sealing assembly.

The sealing assembly of the connection device can further include a second expandable material.

The sealing assembly of the connection device can further include a shell extending from the inverted polished bore housing of the connection device, wherein the expandable material is mounted on the shell.

Some replacement assemblies also include a hanger sub-assembly fixed to the connection surface of the inverted polished bore housing.

In certain aspects, a method includes inserting a replacement assembly having a connection device with a sealing assembly on an end of the connection device, into a wellbore, aligning the sealing assembly with a casing stub projecting from a cement slab, and flowing an activation fluid in the wellbore to activate the sealing assembly. The activated sealing assembly forms a seal between the sealing assembly and the casing stub.

Some methods also include, prior to inserting the replacement assembly, detecting a damaged portion of a longstring casing; and separating a long string casing to form a damaged portion and a casing stub, and removing the damaged portion from the wellbore. The method can further include pressure testing the seal formed by the sealing assembly. In some methods, flowing the activation fluid in the wellbore to activate the sealing assembly comprises flowing the activation fluid in an inner casing or in an outer casing such that the activation fluid contacts an expandable material of the sealing assembly.

Some methods also include, prior to inserting the replacement assembly, milling the casing stub to form a flat rim.

The details of one or more embodiments of the invention are set forth in the accompanying drawings and the description below. Other features, objects, and advantages of the invention will be apparent from the description and drawings, and from the claims.

DETAILED DESCRIPTION

A wellbore system, replacement assembly, and connection device are disclosed for guiding alignment and forming fluidic seals between a casing stub and a new inner casing and/or between a lower inner casing and an upper inner casing. The replacement assembly can be used after or during a completion operation. For example, in longstring system applications, the replacement system can be used to replace a damaged or corroded portion of the inner casing.

In upper/lower system, the replacement assembly can be used to attach an upper inner casing to the lower inner casing.

The replacement assembly includes the connection device and the new inner casing or upper casing. The connection device has a body, a sealing assembly, and an inner surface defining at least part of a (fluid) channel extending through the connection device. In use, a downhole (second) end of the connection device is inserted into the wellbore and a (first) uphole end of the connection device attaches directly to new production casing. The channel at the downhole end is sized to receive the casing stub so that the casing stub is at least partially arranged in the connection device. In this configuration, the channel fluidly connects the cemented casing stub with the replacement casing connected to the body. These fluid connections form a continuous inner casing channel extending from a downhole end of the casing stub to the surface.

The sealing assembly arranged at the downhole end of the connection device also includes an expandable seal that forms a fluid seal with an exterior of the casing stub when activated by an activation fluid. The seal generated by the sealing assembly of the connection device is capable of withstanding pressures between 5000 psi and 15000 psi. The sealing device, in a final, expanded state isolates the inner casing channel from fluids in an annulus of the wellbore, exterior to the casing stub, connection device, or new inner casing.

The inner surface defining the fluid channel of the connection device is a smooth inner surface which has been treated by a nitrating gas treatment. For example, the inner surface of the connection device may be an inverted polished bore housing, which is a piece of pipe formed by a material with tight manufacturing tolerance as compared to normal steel casing. Further, the polished, smooth inner surface reduces frictional effects of tubulars ran inside the channel of the connection device. For example, stub casing can uncontrollably contact the smooth inner surface of the connection device during guidance and alignment, however, such contact may not result in significant damage due to the smooth inner surface. Thus, the smooth inner surface of the connection device or, in some cases, the body of the connection device, reduces the risk of damaging the casing stub when sealing the connection device to the casing stub.

Figure 1:
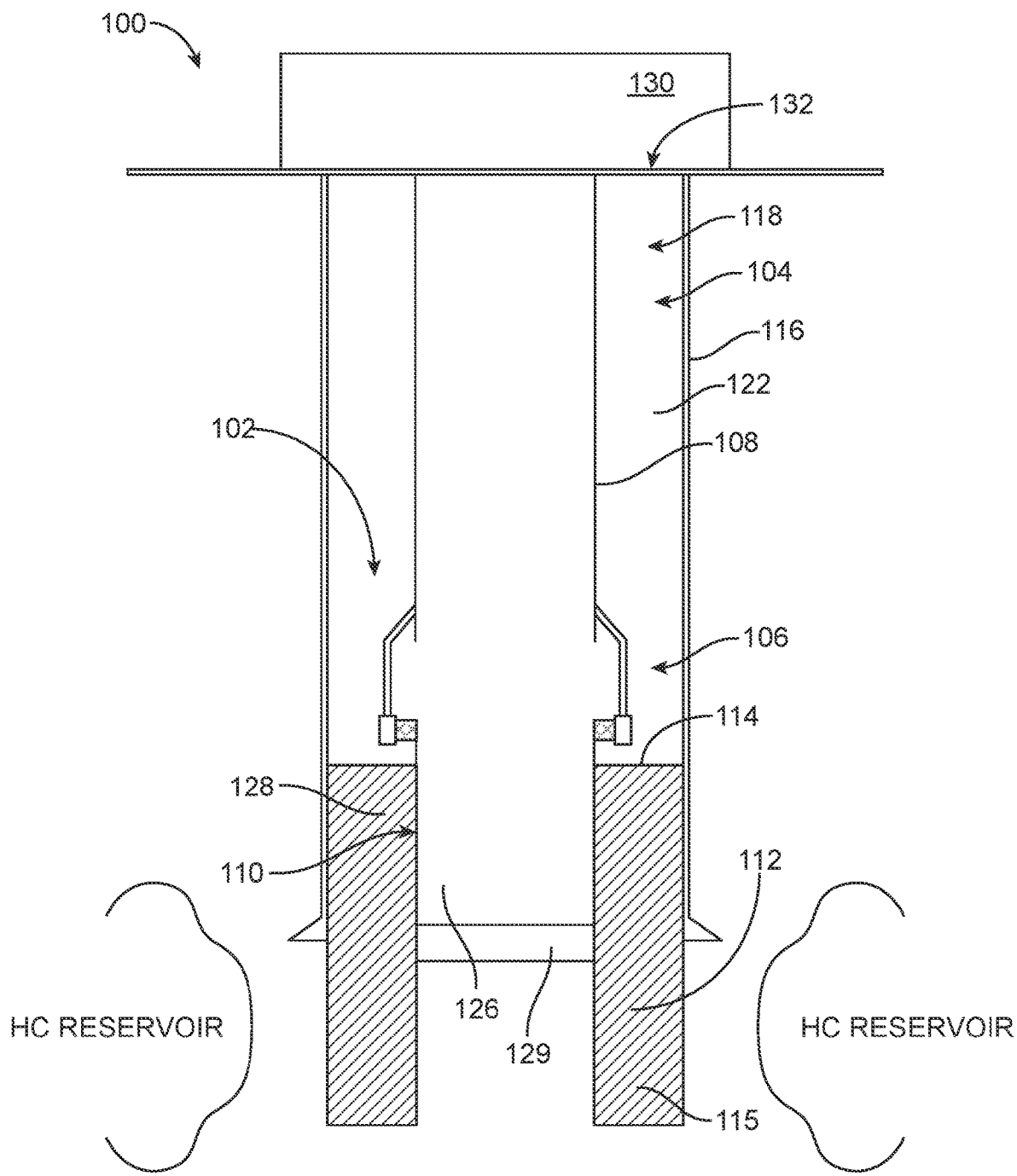
FIG. 1 is a cross sectional view of a replacement assembly of a wellbore system inserted into a wellbore connecting a new inner casing to an existing casing stub using a connection device.

FIG. 1 is a cross sectional view of a wellbore system 100 including a replacement assembly 102 inserted into a wellbore 104. The replacement assembly 102 includes a connection device 106 and an inner casing (e.g., a replacement casing or upper casing) 108. The wellbore system 100 further includes a casing stub 110 fixed to a cement slab 112 with a first (uphole) face 114. The cement slab 112 has an open column 115 through which the casing stub 110 is mounted and into which the casing stub 110 extends. The wellbore system 100 includes an outer casing 116 disposed along a wall 118 of the wellbore 104. An annular volume 122 is defined between the outer casing 116 and the casing stub 110. When the connection device 106 fluidically connects the casing stub and the replacement casing 108, the annular volume 122 is defined between the outer casing 116 and an inner casing 108 made of the casing stub 110, the connection device 106, and the replacement casing 108. The connection device 106 also seals an exterior 126 of the casing stub 110 to the connection device 106 to isolate and interior 128 of the casing stub 110 from the annular volume 122.

The wellbore system 100 also includes an isolation plug 129 disposed in the interior 128 of the casing stub 110 and includes surface tools 130 arranged at or adjacent a wellbore opening 132. The surface tools 130 include a cement pump, a cement source, wipers, tubing hangers, tubing spools, fluid sources (e.g., a mud source, drilling fluid source, brine source), and fluid pumps. The surface tools can also include expendable hanger-liner systems, annular packers, and a variety of downhole tools (e.g., setting tools and running tools).

The replacement assembly 102 includes the new inner casing 108 and may also include production tubing and production seals arranged on, in, or integral with the inner casing 108. The replacement assembly 102 is configured to attach the inner casing 108 to the casing stub 110 in order to conclude the completion operation and begin rigless operation. The replacement assembly 102 connects the inner casing 108 to the casing stub 110 via the connection device 106.

Figure 2:
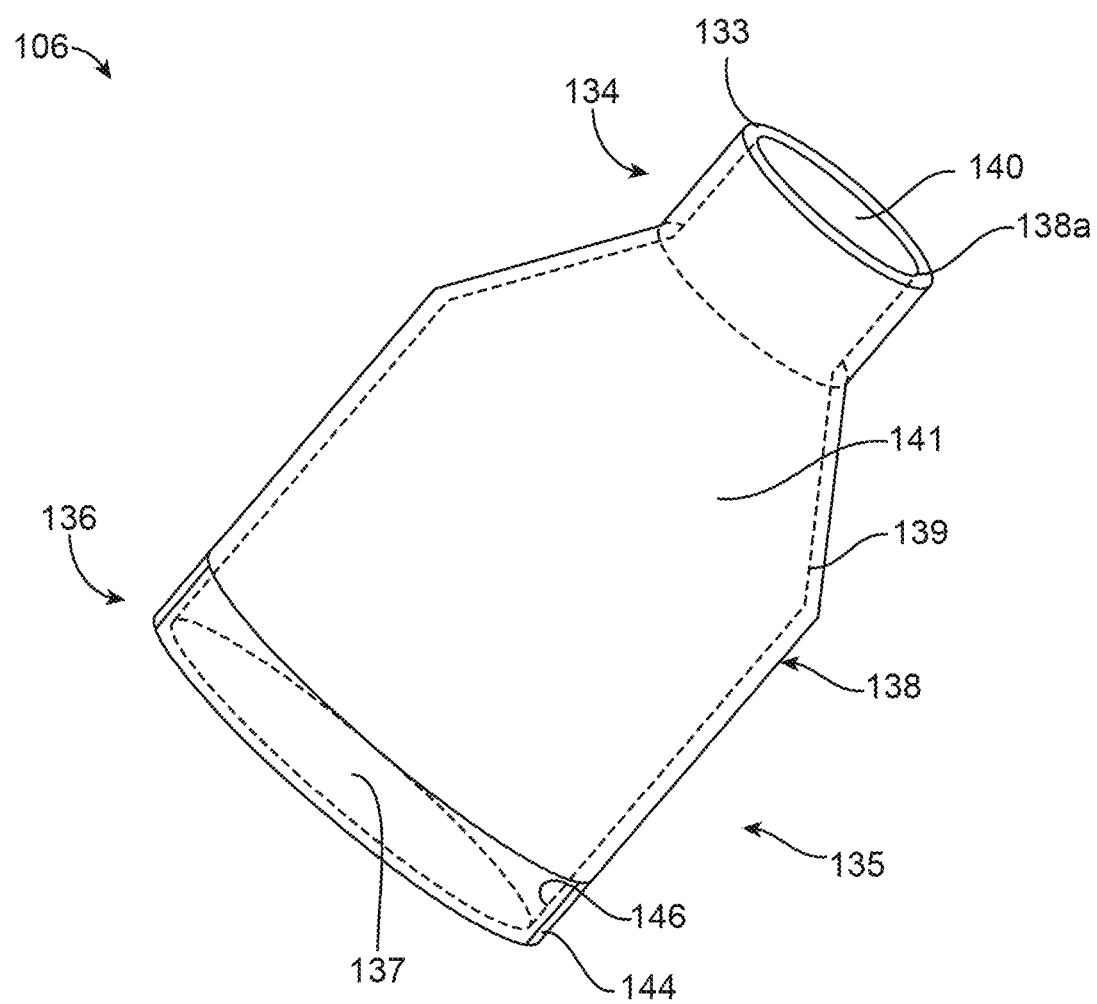
FIG. 2 is a perspective view of the connection device having a body and a sealing assembly.

FIG. 2 is a perspective view of the connection device 106 having a connector 133 at a first open end 134 and a body 135 extending from the connector 133 to a second open end 136 of the connection device 106. The first (uphole, production tubing, attachment) open end 134 of the connection device 106 defines a first (uphole) opening and the second (downhole, stub casing, sealing) end open 136 defines a second (downhole) opening 137, fluidly connected to the first opening by an interior volume 139 of the body 135. The connector 133 at the first end 134 of the connection device 106 is configured to connect to the new inner casing 108. Inner casings and first openings of connection devices can have equal or similar inner diameter to produce a smooth fluid flow.

The connector 133 of the connection device 106 provides a connection surface 138a between the first end 134 of the connection device 106 and the inner casing 108. The connector 133 is a box connector having an internal thread as the connection surface 138a. The connector 133 is a non-American Petroleum Institute (API) connector for forming gas tight connections. Non-API connectors are used to withstand higher loads as compared to API connectors and include an added shoulder at the free end of the connector. When implementing non-API connectors, a make-up of shoulder torque is added during connection to ensure full metal-to-metal isolation and reduce the chance of leaks/loads failure. The connector 133 is configured to connect to a pin connector of an uphole pipeline (e.g., the replacement casing 108). The replacement casing 108 (e.g., with the pin connector) mates or engages the connection surface 138a of the connector 133 of the connection device 106 and rotates to attach the replacement casing 108 to the connector device 106. The connector device and/or the replacement casing are then torqued up (e.g., further rotated) to a predetermined range of make-up of shoulder torque (minimum to maximum) to establish a gas tight, metal to metal connection. In a properly connected connector, the make-up of shoulder torque is applied to the specifications of the thread (neither exceeding nor going below), to prevent and/or reduce leaks at the transition between the connection device 106 and the replacement casing 108.

The first opening at the first end 134 is defined by the connector 133 and/or connection surface 138a with a first opening inner diameter Doi. The body 135 further includes a smooth interior surface 140 at least partially defining the interior volume 139 of the connection device 106. The interior volume 139 extends from the first opening to the second opening 138 when fluid flows in the interior volume 139. The second end 136 of the connection device 106 is a guide pipe with a flat (straight) opening. In some connection devices, the second end is a guide pipe with a slanted end.

In some systems the second end of the connection device is a pin connector having threads. The pin connector is configured to connect to a box connector of a guide to extend the length of the connector. The connected guide pipe may have a flat or slanted free end to receive the casing stub.

The inner surface 140 of the body 135 is machined to a fine surface, smooth surface. The smooth surface 140 can protect equipment inserted into the connection device 106, for example, seal assembly rubber elastomers, from damage. The smooth interior surface 140 is formed by a material treated by a nitrating gas treatment and provides a low friction surface. The interior surface may be or comprise a non-corrosive, smooth metal alloy, for example, carbon Steel, C-110.

In some systems, assemblies, or devices, the body may be or include an inverted polished bore receptacle or inverted polished bore housing. In the art, a "polished bore receptacle" (PBR) is a smooth, tight-tolerance pipe with a honed internal diameter surface for landing sealing assemblies of production tubing inserted above the PBR. A PBR is generally employed in a casing liner completion, as a part of the hanger system. A specific gas nitrating process is applied to the PBR during manufacturing, which creates a hardened and non-corrosion finish to the inner diameter of the PBR. This process is impregnated into the PBR material and does not affect diameter tolerances or separate during thermal material movements. The hardness allows for drilling tools to pass or rotate through the PBR without damaging the inner surface during drilling of the horizontal section below it. In a PBR, the "sealing end" is oriented uphole and receives production tubing and production tubing seal assemblies. In the present disclosure, an "inverted polished bore receptacle" is distinct from a polished bore receptable. An "inverted polished bore receptable" ("IPBR") undergoes the same material treatment as a PBR to retain the improved harness, texture, and non-corrosive properties, however, an IPBR has a polished bore housing oriented in the opposite direction as compared to a typical PBR. In the IPBR, the comparable end is instead oriented downhole and guides a downhole casing stub, into the proper alignment without damaging the stub. Further sealing assemblies for such a downhole connection are directly attached to the IPBR.

The second end 136 of the connection device 106 connects and seals to the casing stub 110 (FIG. 1). The seal is rated between about 5,000 psi and about 15,000 psi. The second end 136 of the connection device 106 is sized to receive the casing stub 110 and has a diameter at least equal to or greater than a diameter of the exterior 126 of the casing stub (FIGS. 1, 5A-5E). An expandable portion 141 of the connection device 106 is configured to at least partially close to form a seal with the casing stub 110 when activated, for example by an activation fluid.

The expandable portion 141 in the system 100, is a sealing assembly 141 The expandable portion, or a section thereof, swells or expands when exposed to an activation fluid. The activation fluid may be oil-based activation fluid or water-based activation fluid. When the activation fluid is applied to the expandable portion 141, (e.g., a rubber composite of the expandable portion is exposed to the activation fluid), the expandable portion 141 (e.g., by the rubber composite material) absorbs the activation fluid until fully saturated, then swells to a final diameter to seal the connection device 106 to the casing stub 110.

Exposure to an activation fluid can include any application of the activation fluid to the expandable portion 141. For example, the activation fluid can be misted, sprayed, steamed, or squirted onto at least a section of the expandable portion. In some cases, at least a section of the expandable portion can be inserted, plunged, bathed, soaked, or immersed in or by a volume of activation fluid. The volume of activation fluid may be a circulated volume with a flow rate and flow path or may be a fixed volume of static activation fluid (e.g., an activation fluid bath).

The activation fluid may be an oil-based activation fluid or a water based activation fluid. In some expandable portions, the activation fluid is present prior to insertion so that the expandable portion activates during insertion. In some systems, an activation fluid is applied to the expandable portion prior to insertion so that the expandable portion is activated at the surface. In some systems, the expandable portion includes a dissolvable coating to delay contact between an activation fluid and the expandable portion.

The connection device 106 also includes the sealing assembly 141 disposed on the inner surface 140 of the body 135, between the first end 134 and the second end 136 of the connection device 106. The sealing assembly 141 has an inactivated state, an activated state, and a final state which controls the presence of and/or the strength of a seal between the casing stub 110 and the connection device 106. The states of the sealing assembly 141 are described with further reference to FIGS. 3A-3C.

The sealing assembly 141 includes an expandable material 142 (FIGS. 3A-C), a first tapered collar 146, and a second tapered collar 144. The first and second tapered collars are welded, attached, mounted, or adhered to the inner surface of the body 135 and extend from the inner surface 140 into the interior volume 139 of the body 135. The first and second collars 146, 144 flank (e.g., sandwich or abut) the expandable material 142 so that the expandable material 142 is arranged between the first and second collars 146, 144. The tapered collars 146, 144 each include a ramp 143 (e.g., a taper, slanted section). The ramp 143 extends from the inner surface of the body 135 to a lip of the expandable material, (e.g., the unswollen expandable material) to form a smoot tapered profile where the unswollen, expandable material 142 extends into the interior volume 139 of the body. In this configuration, the ramp 143 has a surface (first) end having a surface ramp diameter Dsr and a material (second) end 147 having a material ramp diameter Dmr. The surface ramp diameter Dsr is equal to the diameter of the inner surface Dis of the body 135. The proximal ramp diameter Dmr is equal to a diameter of the expandable material in a first, unswollen (e.g., inactivated) position Dii.

Figure 3A:
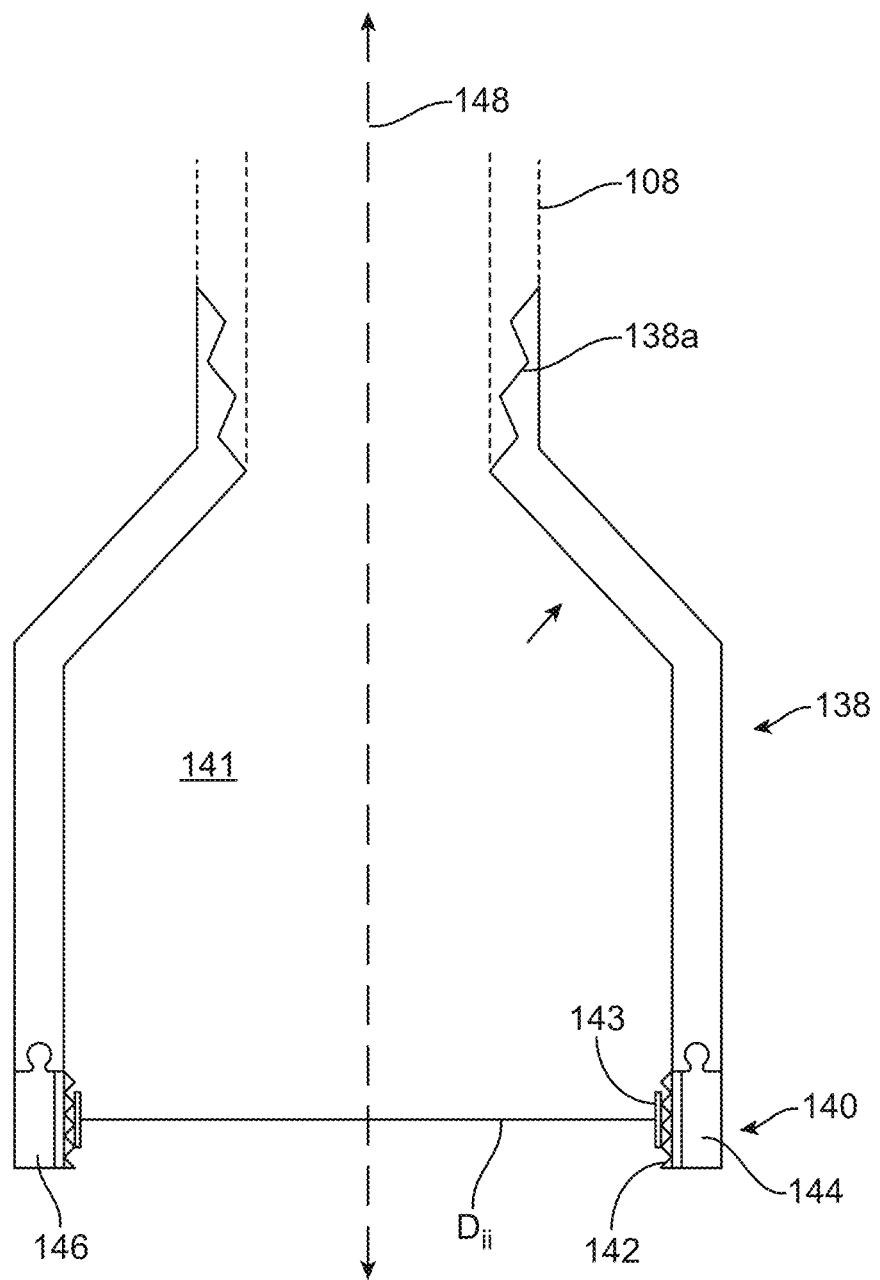
FIGS. 3A-C are cross sectional side views of the connection device and the sealing assembly in a first inactivated state, a second activated state, and a third final state.
Figure 3B:
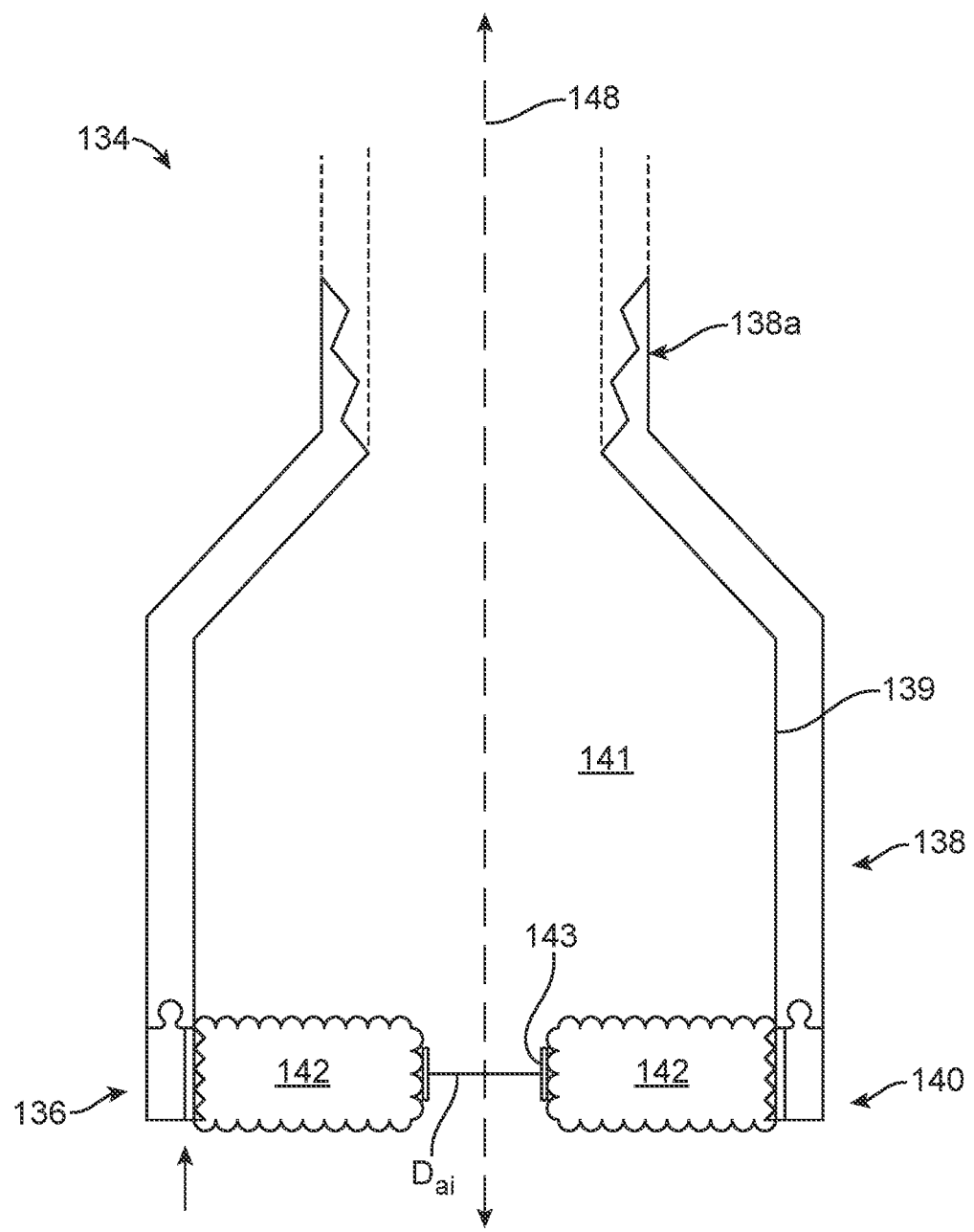

FIG. 3A is cross sectional side view of the connection device 106 with the sealing assembly 141 in the inactivated state. The sealing assembly 141 includes the expandable material 142, the first collar 146, and the second collar 144. In a wellbore, the second side may orient towards a wellbore wall or outer casing. The expandable (swellable) material 142 is mounted on and/or welded to the inner surface of the body 135. The expandable material 142 is configured to expand in the presence of an activation fluid, thereby transitioning from an inactivated state (FIG. 3A) to an activated state (FIG. 3B). In the connection device 106, the expandable material 142 is prevented from expanding past the inner surface 140 of the body 135 and can expand only away from the body 135. The movement of the expandable material away from the body 135 decreases the inner diameter of the sealing assembly 141.

The seals formed by the expandable material maintain operational wellbore pressures and prevent leaks from the inner casings to the annular volume, and/or between partitioned (by seals) sections of the annular volume. For example, the seals formed by the expandable material and/or the sealing assembly can have a pressure rating of about 3,000 psi to about 20,000 psi. In some configurations, a seal formed by the expandable material in the activated state has a lower pressure rating than a seal formed by the expandable material in the final state. In some systems, a seal formed by the expandable material in the activated state has a higher pressure rating than a seal formed by the expandable material in the final state.

The expandable material 142 is an elastomeric expandable material, (e.g., rubber composite material(s)). In some sealing assemblies, the expandable material can be or include water-wet rubber composite materials, and/or oil-wet rubber composite materials. In some cases, an inner perimeter, edge, or face of the expandable material that defines the second opening of the connection device. The expandable material can have an irregular shape, or a generally geometric shape and an opening defined in the expandable material.

The expandable material 142 and the inner surface 139 of the body 135 are generally cylindrically shaped and concentrically arranged on a shared axis 148. The shared axis can be defined by the body, the sealing assembly, the casing stub, the inner casing, or the connection device. The expandable material 142 is arranged concentrically within the body 135 . . . . In the connection device 106, the expandable material 142 forms an expansion face 143 that moves towards the shared axis 148 as the expandable material 142 expands. The expansion face 143 defines the second opening 137 of the second end 136 of the connection device 106. The second opening 137 has a variable diameter that changes as the sealing assembly 141 transitions between the inactivated state, the activated state, and the final state.

Initially, the sealing assembly 141 is inserted and remains in the inactivated state until actuated by a user or by environmental conditions, as shown in FIG. 3A. In the inactivated state, the sealing assembly 141 has an inactivated inner diameter $D_{ii}$. In particular, the expandable material 142 defines the second opening 137, the size and diameter of which can vary depending on the presence, volume, and/or concentration of an activation fluid (e.g., a water-based completion brine, or oil-based completion brine). The sealing assembly 141 is submerged in the activation fluid, or a fluid containing at least 75% activation fluid. In water-based completion brines, the water in the brine can swell the swellable material. In oil-based completion brines, diesel or another oil can swell the swellable material. The water activated packers swell water and expand. The same applies for the diesel (oil) activated. An activation component of the activation fluid can be water, diesel, and/or another component in the completion brine or activation fluid. Some completion brines contain about or more than 75% activation fluid (water) and about or less than 25% oil. The inactivated diameter Di is chosen or designed to be greater than a diameter of the casing stub 110 $D_{cs}$ so that second end 136 of the connection device 106 can receive the casing stub 110. The size, shape, and diameter (inner and/or outer) of the casing stub can be known or can be measured using downhole tools. The inactivated diameter is about 0.3 to about 0.5 inches larger than the outer diameter of the casing stub 110. In some cases, the inactivated diameter is 0.2 inches to about 3 inches.

FIG. 3B is a cross sectional side view the connection device 106 with the sealing assembly 141 in an activated state. In the activated state the expandable material 142 is expands towards the axis 148 due to an interaction with activation fluid. The activation fluid may be aqueous chemical solutions, water brine based fluids (e.g., potassium or sodium chloride dissolved in water), diesel based fluids, or synthetic oil based fluids. In the activated state, the sealing assembly 141 defines the second opening 137 so that the second opening 137 has an activated inner diameter Dai or a plurality of activated inner diameters as the expansion face 149 moves towards the axis 148. For example, the activated inner diameter may be any diameter between 1 inch and 6 inches, for example about 4 inches to about 6 inches, about 4.5 inches to about 5.5 inches, about 3 inches to about 6 inches, or about 1 inch to about 3 inches, about 1 inch to about 4 inches, about 2 inches to about 6 inches. In some cases, the swell able packer is configured to swell about or less than 8 inches, for example, about or less than 6 inches, about or less than 5 inches, about or less than 4 inches, about or less than 3 inches, about or less than 2 inches, or about or less than 1 inch.

In the system 100, the expansion face 149 of the swellable material 142 can expand up to 4 inches. Where the expansion face 149 is activated and moves about 2 inches from the inactivated state, the sealing assembly is capable of forming a seal with a 10,000 psi pressure rating. Where the expansion face 149 is activated and moves about 4 inches from the inactivated state, the expansion face is capable of forming a seal with a 5,000 psi pressure rating. The expandable material 142 continues to expand until reaching the final state, reducing the activated inner diameter Dai until arriving at a final diameter $D_{fi}$ in the final state. The change between the final diameter $D_{fi}$ and the inactive diameters $D_{ii}$ is about or less than 4 inches. In some cases, the change is greater than or less than four inches, for example, about 1 inch, 2 inch, 3 inches, 5 inches, 6 inches, 7 inches, 8 inches, 9 inches, 10 inches, 11 inches, or 1 foot.

Figure 3C:
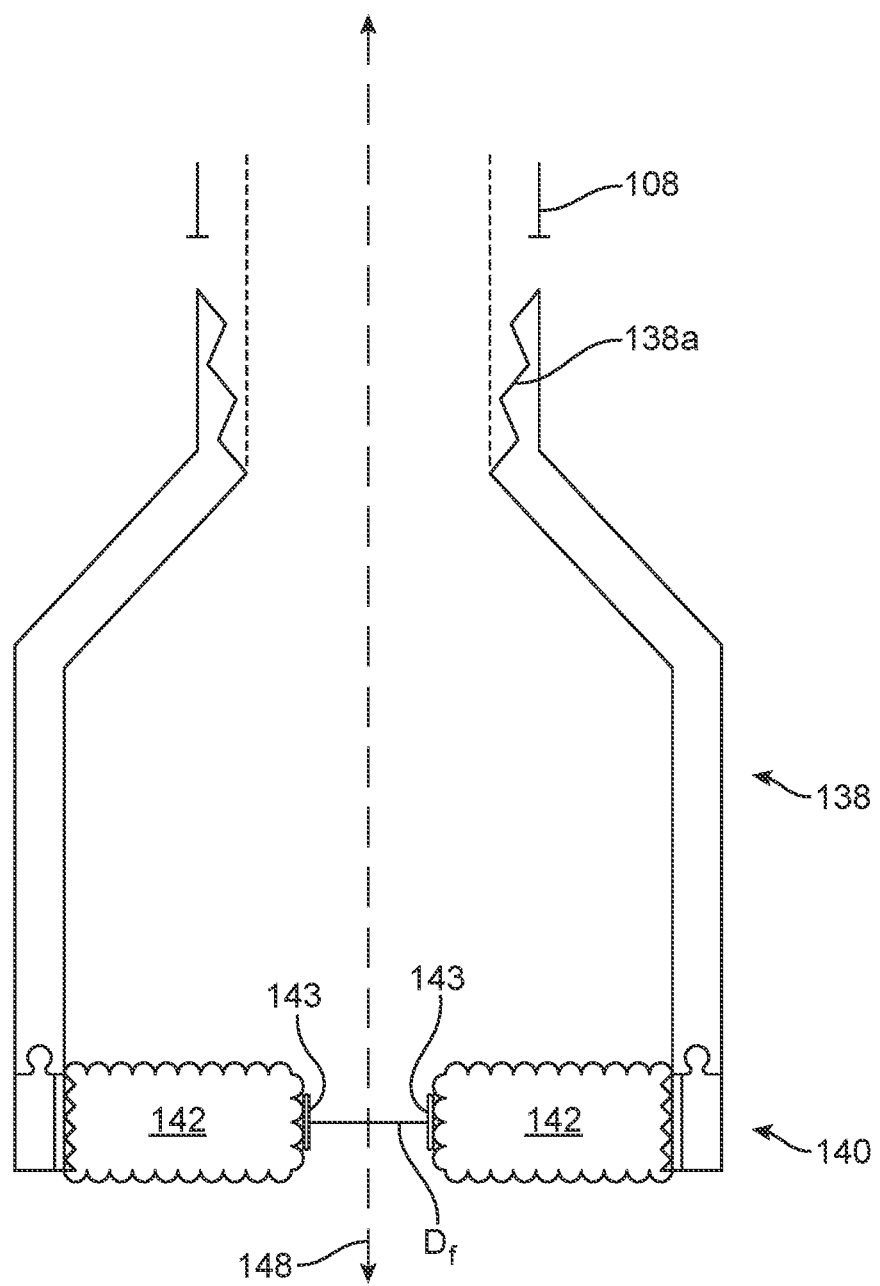

The activated diameter and/or the plurality of activated diameters of the second opening 137, may depend on the presence, temperature, volume, and/or concentration of an activation fluid, a wellbore temperature, a wellbore pressure, a formation pressure, and/or another wellbore parameter. Further, the rate of transition from the activated state to the final state and/or an expansion rate of the expandable material may depend on the presence, temperature, volume, and/or concentration of an activation fluid, a wellbore temperature FIG. 3C is cross sectional side view of the connection device 106 with the sealing assembly 141 in the final state. In the final state, the expandable material 142 reaches a steady final inner diameter $D_{fi}$ either due to reaching an equilibrium or due to contact with a structure preventing further expansion. When employed in a wellbore system, the final state seals the connection device to a casing stub or other tubing inserted into the connection device. The diameter $D_{fi}$ is less than the diameter Dai which is less than the inactivated inner diameter $D_{ii}$. In some cases, the inactivated diameter and/or activated diameter of the expandable material can be greater than a diameter of the first opening at the first end of the connection device. In some cases, the final inner diameter and/or activated diameter of the expandable material can be less than a diameter of the first opening at the first end of the connection device. In some cases, the final inner diameter and/or activated diameter of the expandable material can be equal to a diameter of the first opening at the first end of the connection device.

Figure 4A:
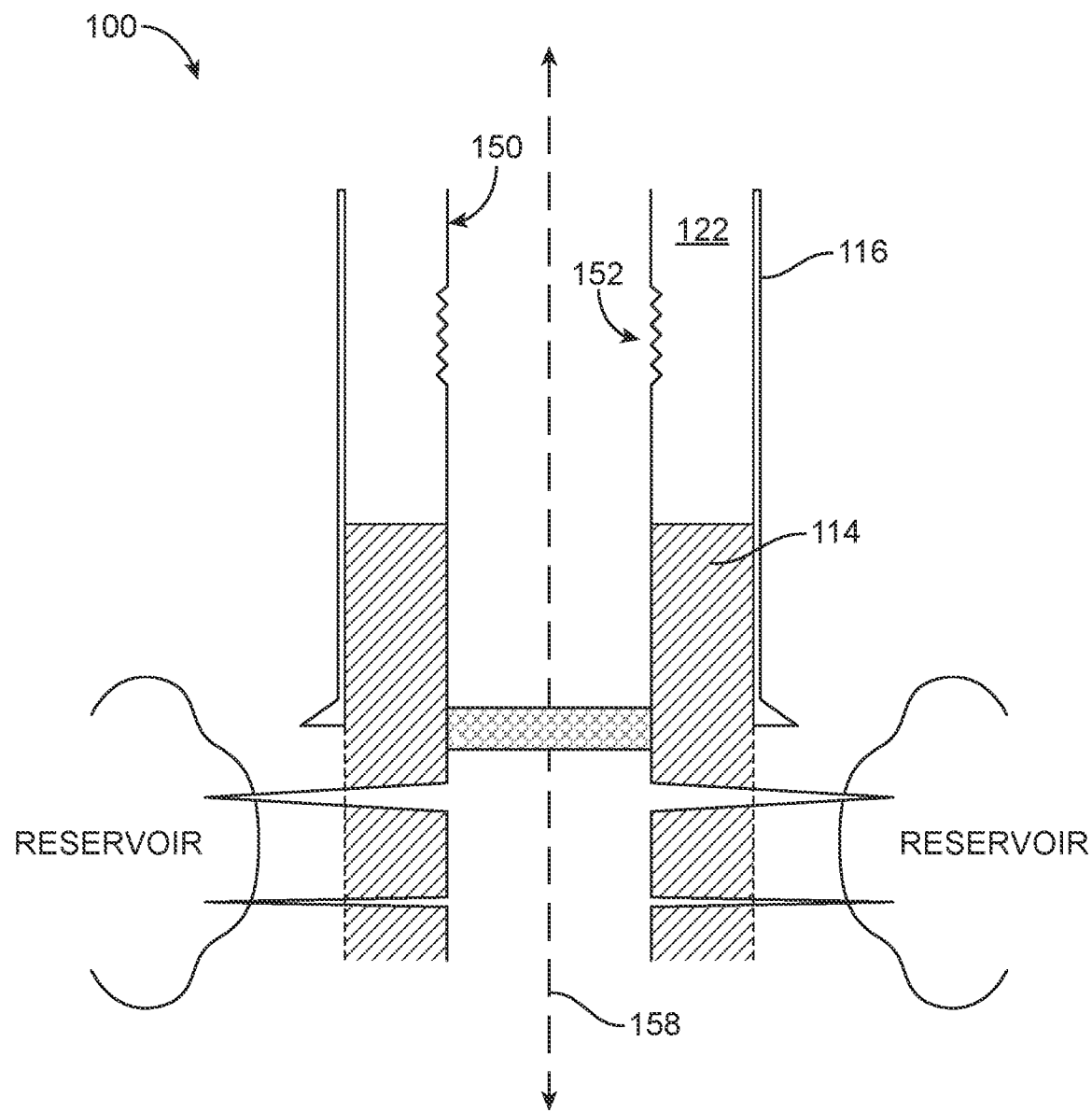
FIG. 4A is a cross sectional side view of a wellbore system having a damaged portion of an inner casing.

FIGS. 4A-4F are cross sectional side views of the wellbore system 100 during replacement operations. The system 100, is configured as a longstring completion system with a cemented longstring casing 150. FIG. 4A is a cross sectional side view of the wellbore system 100 with a damaged longstring casing 150 which must be replaced so that the wellbore system 100 can operate and/or operative effectively. Some systems include a detection apparatus configured to detect casing damage. In some systems, the inner casing is undamaged, but a surface tool malfunctions. In such a case, the longstring casing or a portion thereof may also require replacement by a replacement assembly.

To fix the damaged longstring casing 150, the wellbore system 100 cuts, removes, and replaces a section of the damaged longstring casing 150 with a new inner casing 108. The connection device 106 is operable to fluidically connect the inner casing 108 to the remaining casing stub 110 of the longstring casing 150. Further, the sealing assembly 141 of the connection device 106 isolates an interior volume 139 of the connection device from the annular volume and is configured to maintain the isolation in high pressure operations, up to 15,000 psi.

In the longstring casing 150, shown in FIG. 4A, the longstring casing 150 has a damaged portion 152 uphole of the cement slab 112. A cutting tool is conveyed into the wellbore 104 via the longstring casing 150 or the annular volume 122. The cutting tool cuts the longstring casing 150 at a location between the damaged portion 152 and the cement slab 112 (top of the cement slab 112). Cutting the longstring casing 150 separates the longstring casing 150 into a removable portion 154, containing the damaged portion 152, and the casing stub 110 cemented into the cement slab 112. The casing stub 110 is cut to project from the cement slab 112. In some systems, the casing stub projects at least 50 feet from the cement slap. The removable portion 154 is then removed from the wellbore 104 and the casing stub 110 projects uphole, from the cement slab 112.

Figure 4B:
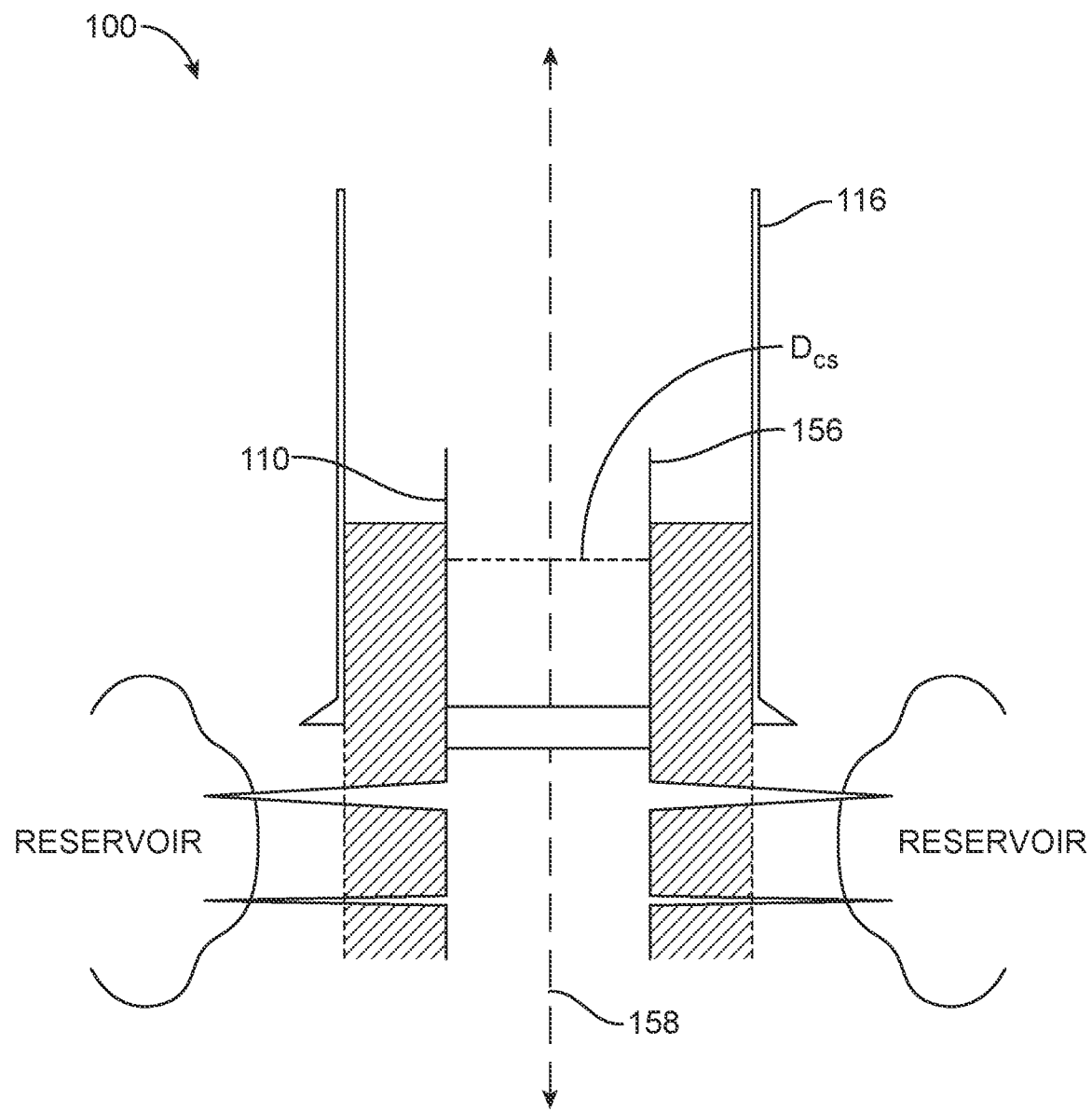
FIG. 4B is a cross sectional side view of a casing stub of the wellbore system of FIG. 4A remaining in the wellbore after separation and removal of the damaged portion of the inner casing.

FIG. 4B is a cross sectional side view of a casing stub 110 of the wellbore system 100 remaining in the wellbore 104 after separation and removal of the damaged portion 152 of the longstring casing 150. In the system 100, the casing stub 110 is an unremoved portion of the original inner casing (longstring casting 150). In some systems, the casing stub is a lower casing completion, for example in an upper/lower completion system.

The casing stub 110 is centered on a first axis 158 and has an inner diameter $D_{cs}$, which is equal to the diameter of the longstring casing 150. The diameter $D_{cs}$ is known and a replacement pipe diameter can be selected to compliment the size of the casing stub 110. For example, the system 100 uses a replacement casing 108 of equal inner diameter. Other systems may use a replacement casing have a greater inner diameter. Some systems may use a replacement casing with an equal inner diameter, but a different outer diameter as compared to the casing stub. After the size, shape, and material of the replacement casing 108 is chosen, the casing 108 is fixed to the first end 134 of the connection device 106.

In some systems, a milling tool may be inserted into the wellbore 104 to mill and flatten a rim 156 of the casing stub 110. Milling the rim 156 to a flattened shape reduces the risk of damage to the inner surface 140 of the connection device 106 and reduces the risk of deformation damage to the casing stub 110. The milling tool, if used, is removed from the wellbore. The replacement assembly 102 with the casing 108 fixed to the connection device 106 is then inserted into the wellbore 104.

Figure 4C:
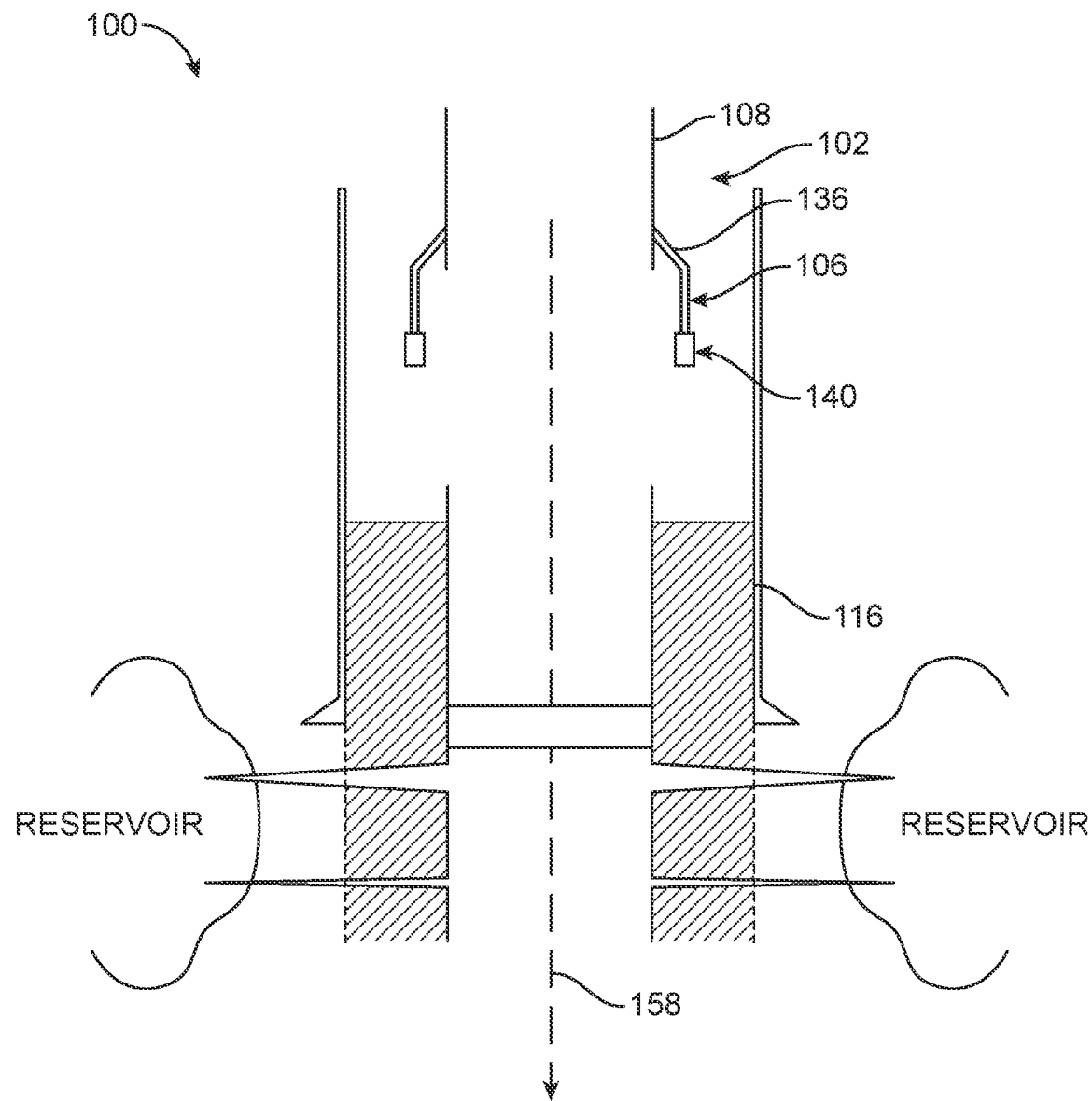
FIG. 4C is a cross sectional side view of the wellbore system of FIG. 6A during insertion of a single-run replacement assembly having the connection device of FIG. 2 and a replacement inner casing.
Figure 11A:
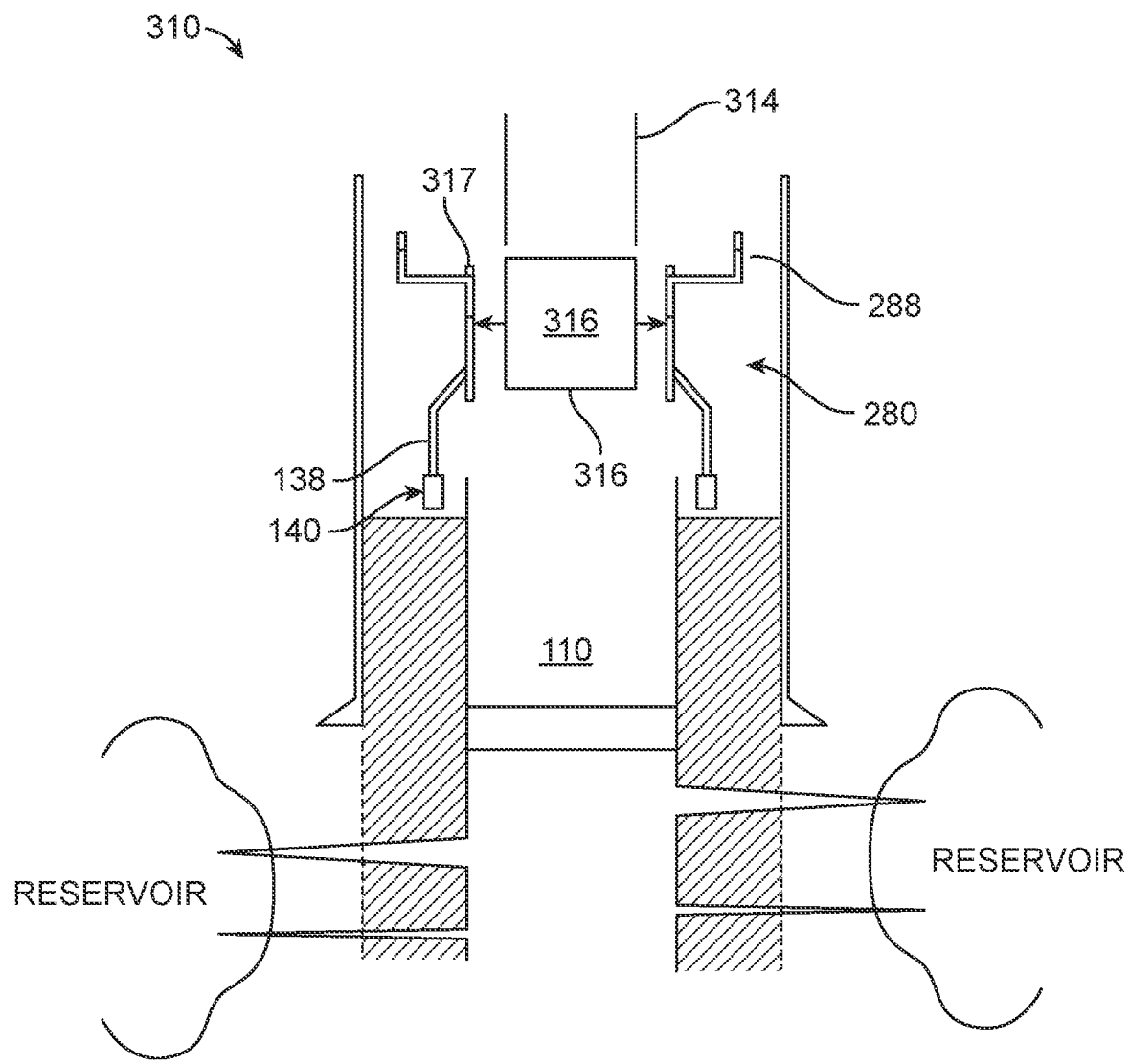
FIG. 11A is cross sectional side view of a wellbore system having a dual-run replacement assembly with the connection device of FIG. 11A, during a first run insertion.

FIG. 4C is a cross sectional side view of the wellbore system 100 during insertion of the replacement assembly 102. The replacement assembly 102 is landed and sealed in a single run, however, some replacement assemblies are multi-run replacement assemblies. For example, the replacement assembly described with reference to FIG. 11A is a dual-run replacement assembly. The replacement assembly 102 includes the connection device 106 and the inner casing 108. The replacement assembly 102 is inserted so that the second end 136 of the connection device 106 enters the wellbore first and the first end 134 of the connection device and casing 108 are oriented uphole of the second end 136. In this configuration, the sealing assembly 141 at the second end of the connection device 106 defines the second opening 137 and the second opening 137 has a diameter greater than the diameter of the casing stub Des. The sealing assembly 141 is in the inactive state and thus the second opening 137 has an inactivated inner diameter Dai. The inactivated inner diameter Dai is sized to permit the passage of the rim 156 of the casing stub 110 into the interior volume 139 of the connection device 106.

In some systems, the sealing assembly may be in the activated state. The activated inner diameter Dai may be greater than diameter of the casing stub when the replacement assembly is inserted, conveyed axially, and adjusted radially in the wellbore. In some systems, the activated inner diameter Dai is greater than diameter of the casing stub when the replacement assembly is inserted, conveyed axially, and adjusted radially in the wellbore.

The replacement assembly 102 is conveyed axially into the wellbore 104 until arranged above the casing stub. 110. At this stage, the connection device 106 may be arranged on the first axis 148 or may be arranged on another conveyance axis. the conveyance axis may be parallel, but offset, from the first axis or may be at an angle relative to the first axis). In either configuration, the second opening 137 is sized to swallow, or receive the casing stub 110 projecting from the cement slab 112. As such, the replacement assembly 102 continues to convey into the wellbore 104 to receive the rim 156 of the casing stub 110 and a portion of the casing stub 110.

The replacement assembly 102 is stopped in the wellbore when the casing stub 110 is received in the interior volume 139 of the connection device and/or when the inner surface is a specified axial distance d from the rim 156 of the casing stub 110.

Figure 4D:
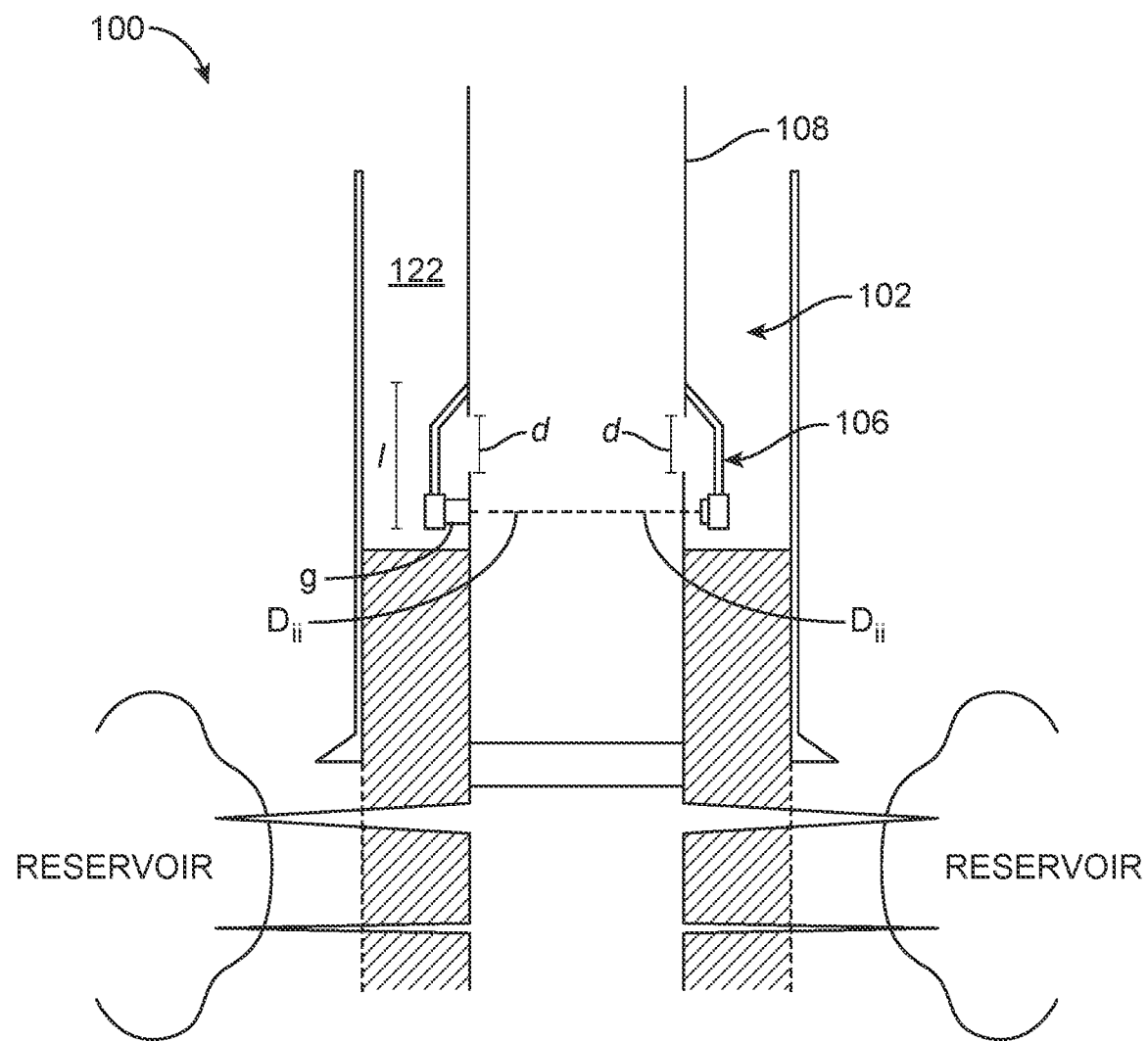
FIG. 4D is a cross sectional side view of the connection device of FIG. 2 in alignment with the casing stub and the sealing assembly of the connection device in the inactivated state.

FIG. 4D is a cross sectional side view of the connection device 106 in alignment with the casing stub 110. In addition, the sealing assembly 141 of the connection device 106 in the inactivated state having and inactivated inner diameter Dia. $D_{ia}$ is larger than the diameter of the casing stub $D_{cs}$. This configured allows the casing stub 110 to pass through the second opening 137 defined by the expandable material 142 and extend into the interior volume 139 of the connection device 106. In alignment, the inner surface 140 of the body 135 is adjacent to but a known distance d from the rim 156 of the casing stub 110. The expansion face 149 of the expandable material 142 is radially aligned but distanced from with an exterior surface 126 of the casing stub 110. The exterior surface 126 extends from the rim 156 of the casing stub 110 to the face 114 of the cement slab 112.

In some cases, the casing stub has a textured surface or a corrugated surface to improve contact between the exterior 126 and the expansion face 149. In some systems, a portion of the expansion face is aligned with the exterior of the casing stub and another portion of the expansion face is aligned with the rim of the casing stub.

The distance d is between the rim 156 and the inner surface 140 of the body 135 directly above the rim 156 is about 0.1 feet to about 3 feet, for example, about 0.5 feet to about 2 feet, inclusive. In some systems, the distance is less that 2 feet to reduce a risk of a wireline and/or slickline tool from getting stuck at the top of the casing stub. In such configurations, subsequent wireline and/or slickline tools run through the system can be centralized, thereby reducing the risk of the tool getting stuck a the rim of a case stub. The alignment distance is an axial distance which measures the distance from the rim 156 to the inner surface 140 of the body 135 along in a direction parallel to the axis 158.

To be in spaced axial alignment with the casing stub 110 at a predetermined or known distance d, the connection device 106 has a length l at least equal to the alignment distance d. The connection device 106 has a length l greater than the distance d. The connection device 106 has a length of about 1 foot to about 100 feet, e.g., about 5 feet to about 75 feet, about 10 feet to about 50 feet, about 12 feet to about 35 feet, or about 15 feet to about 30 feet. [0087] A gap 162 is defined between the expansion face 149 and the exterior 126 of the casing stub 110. The gap 162 shrinks as the expansion face 149 moves towards the exterior 126 of the casing stub 110. The gap is non-existent, or 0, when the expansion face 149 contacts the exterior 126 of the casing stub 110. The gap has a length g which is measured in a radial direction from the exterior 126 of the casing stub 110 to the aligned or corresponding location of the expandable material at the same depth in the wellbore. The radial direction is a direction perpendicular to the axis 18 and intersects the axis 158. The gap 162 has a length g of about 0.1 inch to about 0.5 inches, for example, about 0.15 inches to about 0.25 inches. The replacement assembly 102 is centered on the axis 158, however, in some systems, the replacement assembly may be offset from the axis 158 or at an angle relative to the axis 158. In such a configuration, a section of the inner surface of the body may be closer or farther to the rim of the casing stub than another section of the inner surface. Such a configuration may be considered to be aligned when the closest section of the inner surface of the body is a predetermined distance from the rim of the casing stub. Alternatively, the configuration may be considered to be aligned when the farthest section of the inner surface of the body is a predetermined distance from the rim of the casing stub.

Once the connection device 106 is axially aligned with the casing stub and radially aligned with the casing stub 110, an activation fluid flows through the inner casing and/or the outer casing so that the activation fluid contacts the expandable material 142 and the sealing assembly 141 transition from the inactive state to the activated state. The inner diameter $D_{ia}$ of the second opening 137 shrinks until the expansion face 149 of the expandable material contacts the exterior 126 of the casing stub 110. The contact between the casing stub 110 and the sealing assembly 141 moves the sealing assembly into the final state.

Figure 4E:
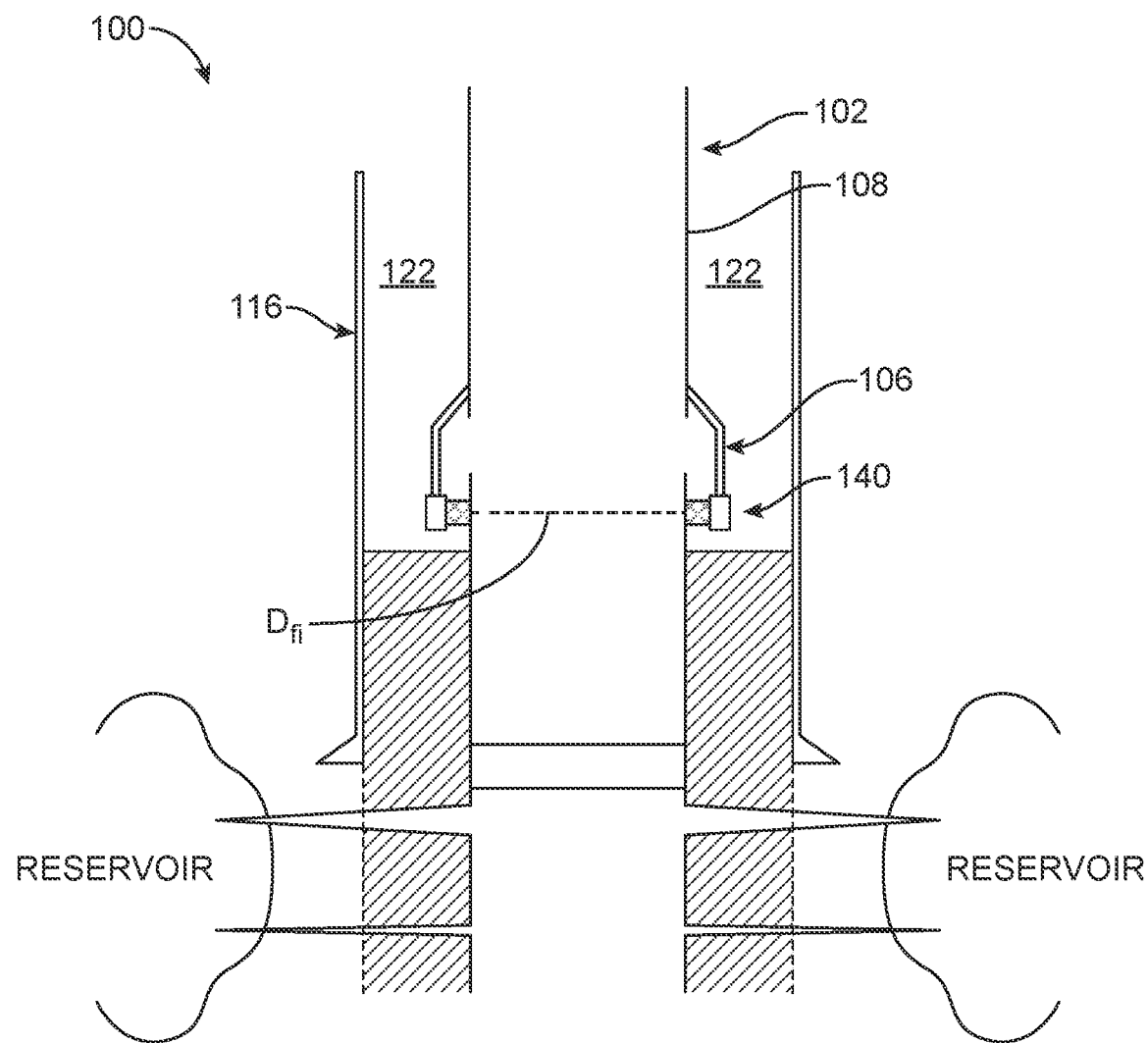
FIG. 4E is a cross sectional side view of the connection device of FIG. 2 with the sealing assembly in the activated state.

FIG. 4E is a cross sectional side view of the connection device 106 with the sealing assembly 141 in the final state. The expansion face 149 of the expandable material 142 contacts the exterior 126 of the casing stub 110 and forms a seal with the casing stub 110. The expandable material may continue to react with activation fluid to improve the seal, however, the diameter of the second opening 137 remains at the steady, final inner diameter $D_{fi}$. The final inner diameter $D_{fi}$ of the second opening 137 is equal to an exterior diameter $D_{ex}$ of the exterior 126 of the casing stub 110. The seal between the expandable material and the casing stub 110 is rated between 5000 psi and 15000 psi. At this stage, the replacement assembly 102 replaced and connected an inner casing to the casing stub 110 capable of maintaining pressures during subsequent wellbore operations. The system may then proceed to rigless operation and/or may be pressure tested to ensure the seal between the expandable material and the casing stub 110 is proper.

Figure 5:
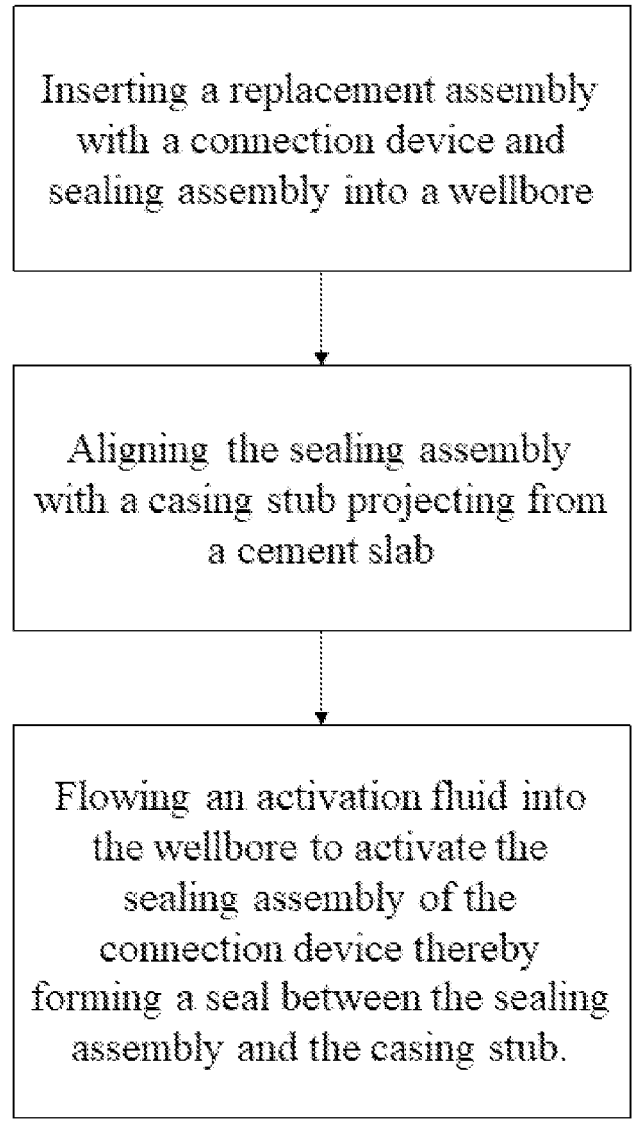
FIG. 5 is a method flow for operating a wellbore system with a single run replacement assembly.

FIG. 5 is a flowchart of a method. The method is described with reference to the system 100, however, the method can be used with any appropriate system. The method includes detecting a damaged portion of a longstring casing; separating a long string casing to form a damaged portion and a casing stub, then removing the damaged portion from the wellbore. The casing stub may be further milled to smooth and jagged edges. The method then includes inserting a replacement assembly having a connection device with a sealing assembly on an end of the connection device, into a wellbore, aligning the sealing assembly with a casing stub projecting from a cement slab, and then flowing an activation fluid in the wellbore to activate the sealing assembly. The activation fluid flows in the wellbore to activate the expandable material of the sealing assembly. The activation fluid can flow through the inner casing, the outer casing, or both. The activated sealing assembly forms a seal between the sealing assembly and the casing stub. The seal formed by the sealing assembly is then pressure tested to ensure that the connection is gas tight.

In some cases, the sealing assembly includes a mounting structure connectable to the body, rather than welding the expandable material directly to the inner surface of the body. In such a configuration, the sealing assembly includes a shell rather than, or in addition to the first and second collars. In such a configuration, the shell is arranged in a recess defined in the inner surface of the body. The shell forms a first side (face) and a second side face. The expandable (swellable) material is mounted, adhered, or welded to the second side of the shell. The expandable material is configured to expand in the presence of an activation fluid. In this configuration, the expandable material is prevented from expanding past the shell and can expand only expand away from the second side of the shell. The movement of the expandable material away from the inner shell moves the expandable material into contact with a structure disposed in the second opening, for example a casing stub.

The shell is attached to the body at a first side (face) and a second side (face) opposite the first side is oriented away from the body In a wellbore, the second side may orient towards a wellbore wall or outer casing. The expandable (swellable) material is mounted on the second side of the shell.

In some devices, the expandable material can expand parallel to the first face so that the expandable material extends past a lower boundary or edge of the shell. In some devices, the expandable material can expand to conform to the shape of the first face of the shell. In such a configuration, the expandable material can also expand around an edge of the first face of the shell to extend past a boundary of the shell, forming a lip of expandable material over the edge of the shell. The lip may also contact another component of the connection device or system. For example, the lip of expandable material may continue to expand and contact the first face of the cement slab forming a seal between the expandable material and the cement slab.

In some cases, the expandable material is mounted to the body and is distanced from the shell. In such a configuration, the expandable material can expand towards both the shared axis and away from the shared axis, up to abutment with the shell. In some cases, the expandable material has known inner and outer diameters which occur when the expandable material is maximally expanded and is not impeded by any structure (e.g., the shell of the sealing assembly or the exterior of the casing stub). The known diameters may vary based on the amount of activation fluid used in the operation or test.

While a configuration for the connector 106 has been disclosed in FIGS. 1-4E, the connection device 106 and replacement assembly can include a variety of connection device configurations. For example, a connection device may include multiple expandable materials in the sealing assembly, as shown in FIGS. 6A-7B. A connection device can also include multiple sealing assemblies distributed axially along the connection device described with reference to FIGS. 8A-9B. Additionally, the connection device can include an expendable hanger assembly, described with references to FIGS. 10A-11C.

Figure 6A:
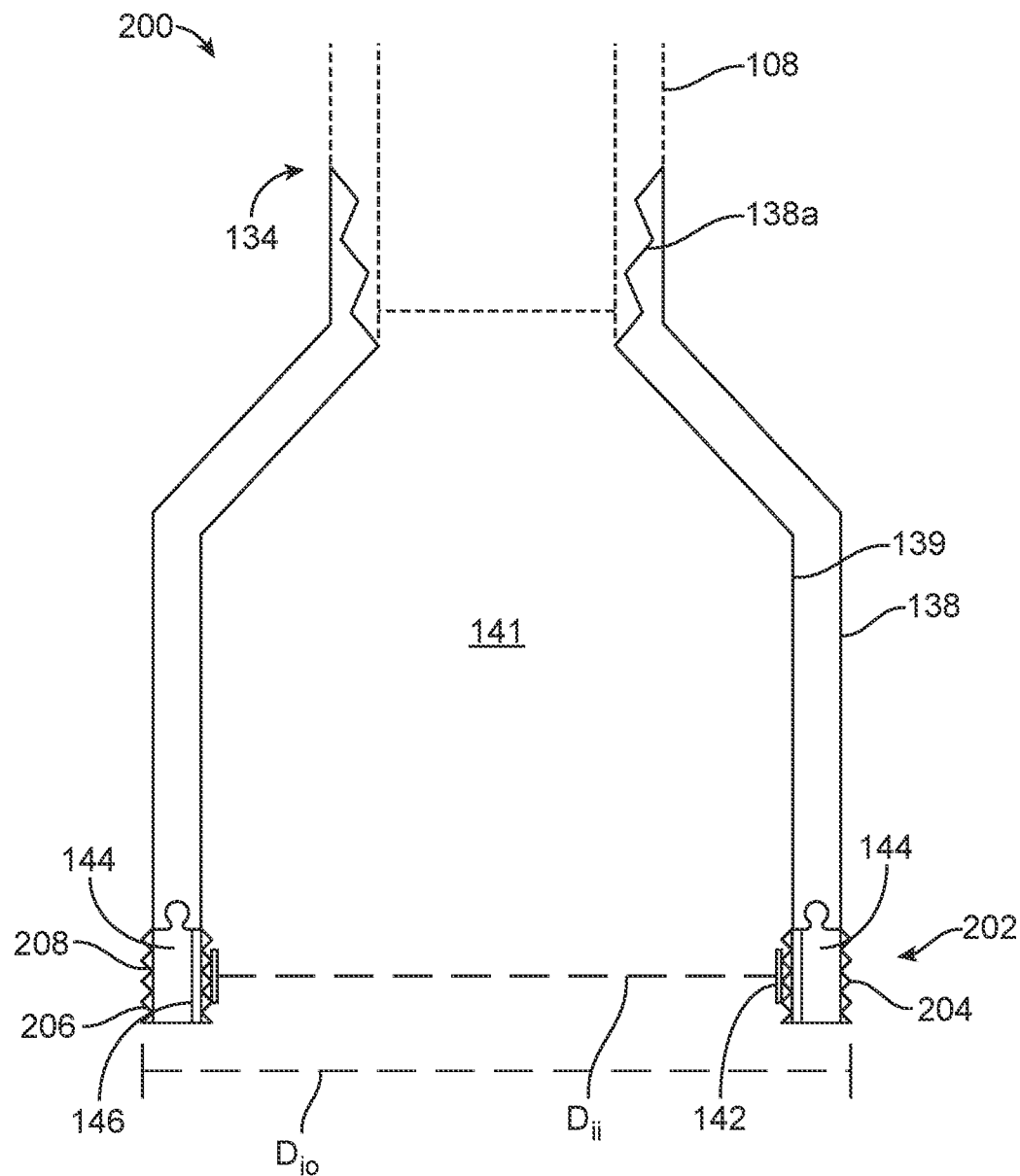
FIGS. 6A and 6B are cross sectional side views of a connection device having a sealing assembly with multiple expandable seals. in the inactivated state and final state, respectively.
Figure 6B:
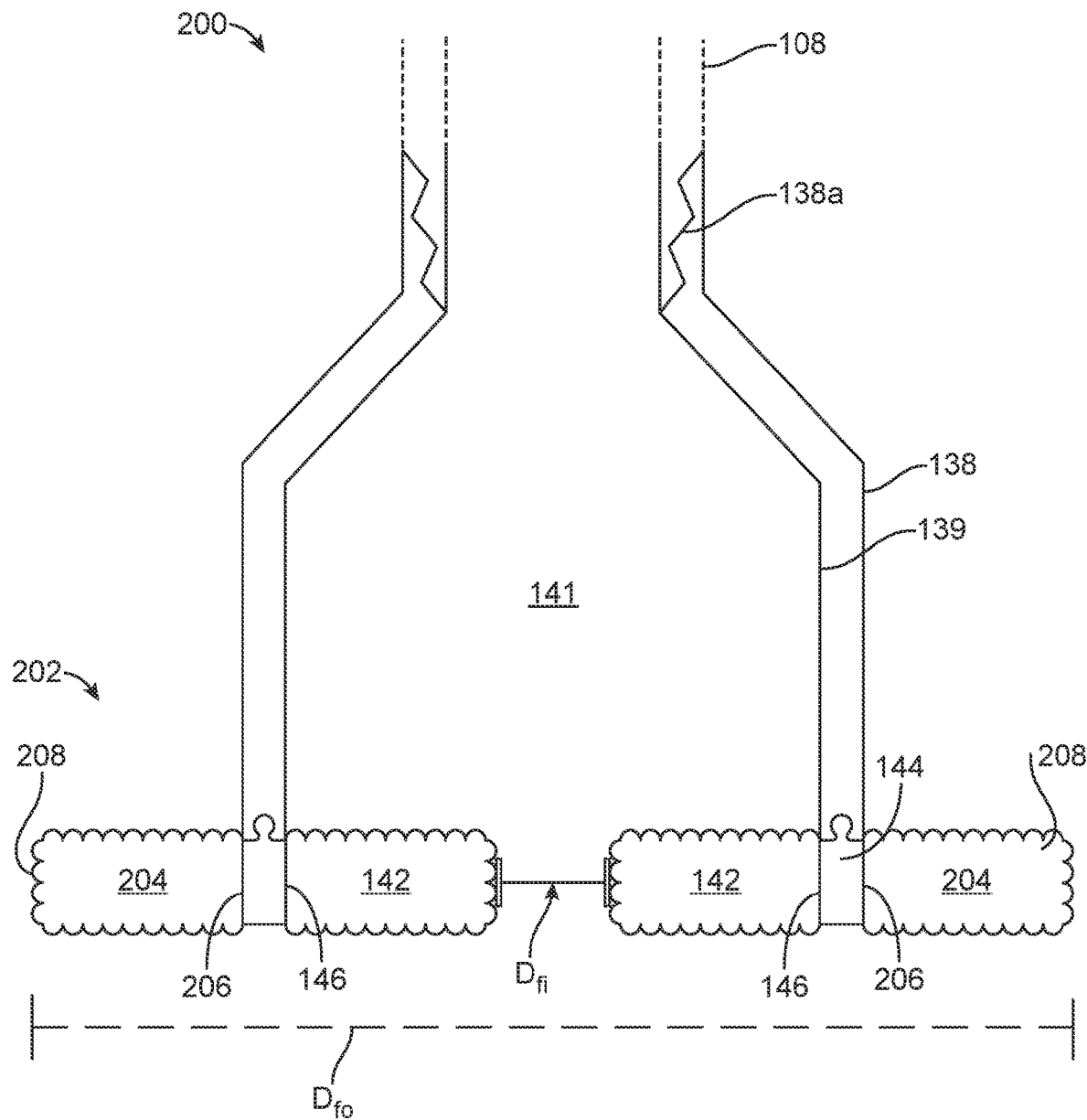

FIGS. 6A and 6B are cross sectional side views of a connection device 200 having a sealing assembly 202 with multiple expandable seals. The sealing assembly 202 is substantially similar to the sealing assembly 141, however, the sealing assembly 202 includes a second expandable material 204 mounted on an outer surface 206 of the of the body 135. The sealing assembly 202 is configured to form a first pressure seal between the casing stub 110 and the first expandable material 142, as described with reference to FIGS. 1-4E. The sealing assembly 202 is also configured to form a second pressure seal between the outer casing 116 (FIG. 7B) and the second expandable material 204.

In the inactivated state, the sealing assembly 202 defines the second opening 137 having an inactivated inner diameter Dai, as described previously with reference to FIGS. 1-4E. The expandable material 142 has a (first, inner) expansion face 149 which moves as the expandable material expands. The expansion face 149 defines an aperture 149a. As the material of the sealing assembly expands, the diameter Di of the aperture shrinks from $D_{ii}$ to $D_{ia}$. In addition, the second expandable material has a second (outer) expansion face 208. The second expansion face 208 moves as the second expandable material 204 expands in the presence of an activation liquid. The second expansion face 208 extends away from the outer surface 206 of the of the body 135. In this configuration, the second expansion face 208 an outer diameter of the second expandable material. The outer diameter of the second expandable material 204 has an inactivated outer diameter $D_{io}$ (FIG. 6A, 7A), an activated outer diameter Dao, and a final outer diameter $D_{fo}$ (FIGS. 6B, 7B), corresponding to the state of the second expandable material.

The second expandable material may transition from the various states at different times than the first expandable material based on the type of activation fluid, material, and wellbore structure in the system. In some sealing assemblies, the first expandable material and the second expandable material are the same material. In some sealing assemblies, the first expandable material and the second expandable material are different expandable materials. In some sealing assemblies, the first expandable material is activated by a first activation fluid and the second expandable material is activated by a second activation fluid. The first activation fluid may be the same activation fluid, a modified first activation fluid (e.g., the same fluid at a different concentration), or a different activation fluid. The first and/or second activation fluid may be an oil-based activation fluid or a water-based activation fluid.

Figure 7A:
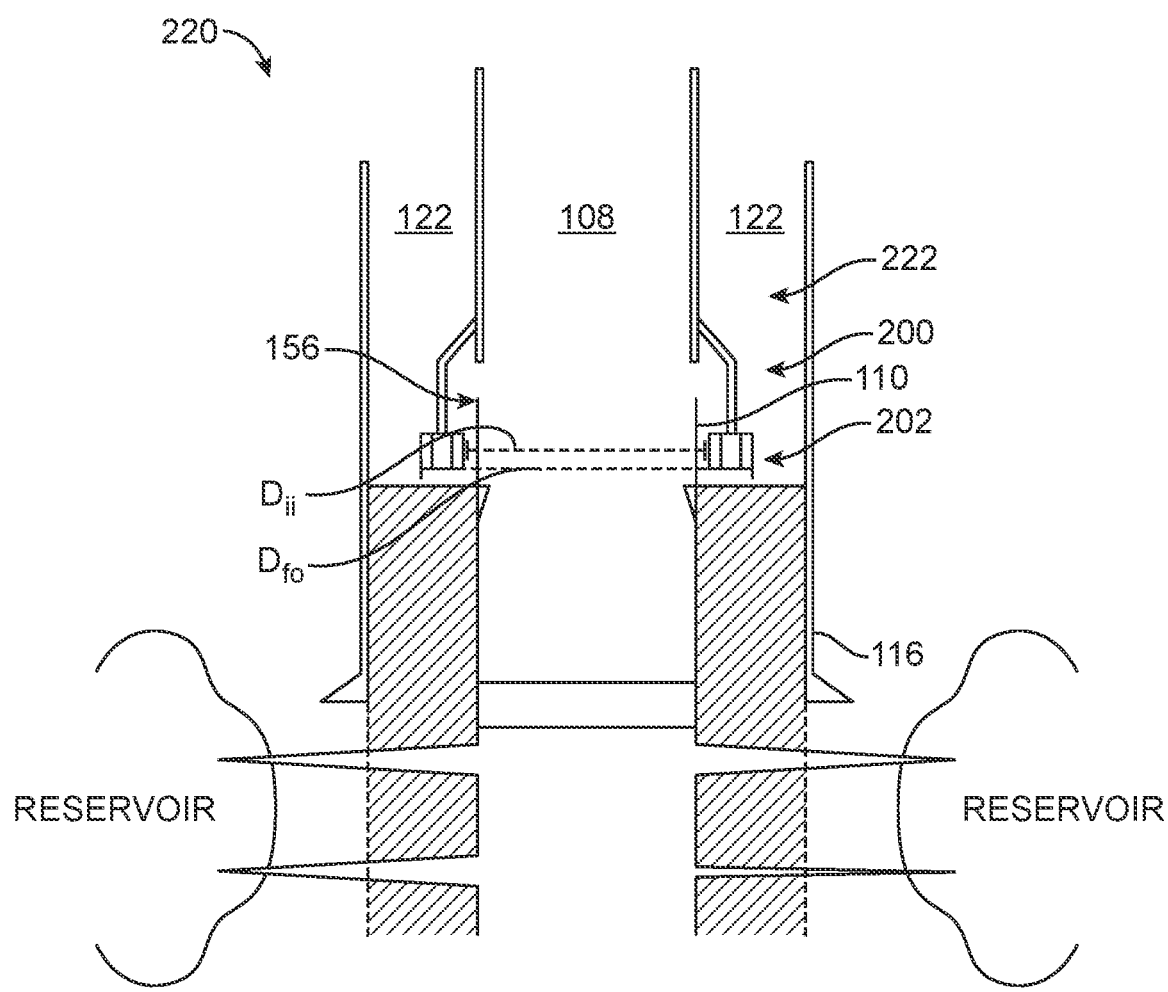
FIGS. 7A and 7B are cross sectional side views of a wellbore system with a replacement assembly having the sealing assembly of the connection device of FIG. 6A, in the inactivated state and final state, respectively.
Figure 7B:
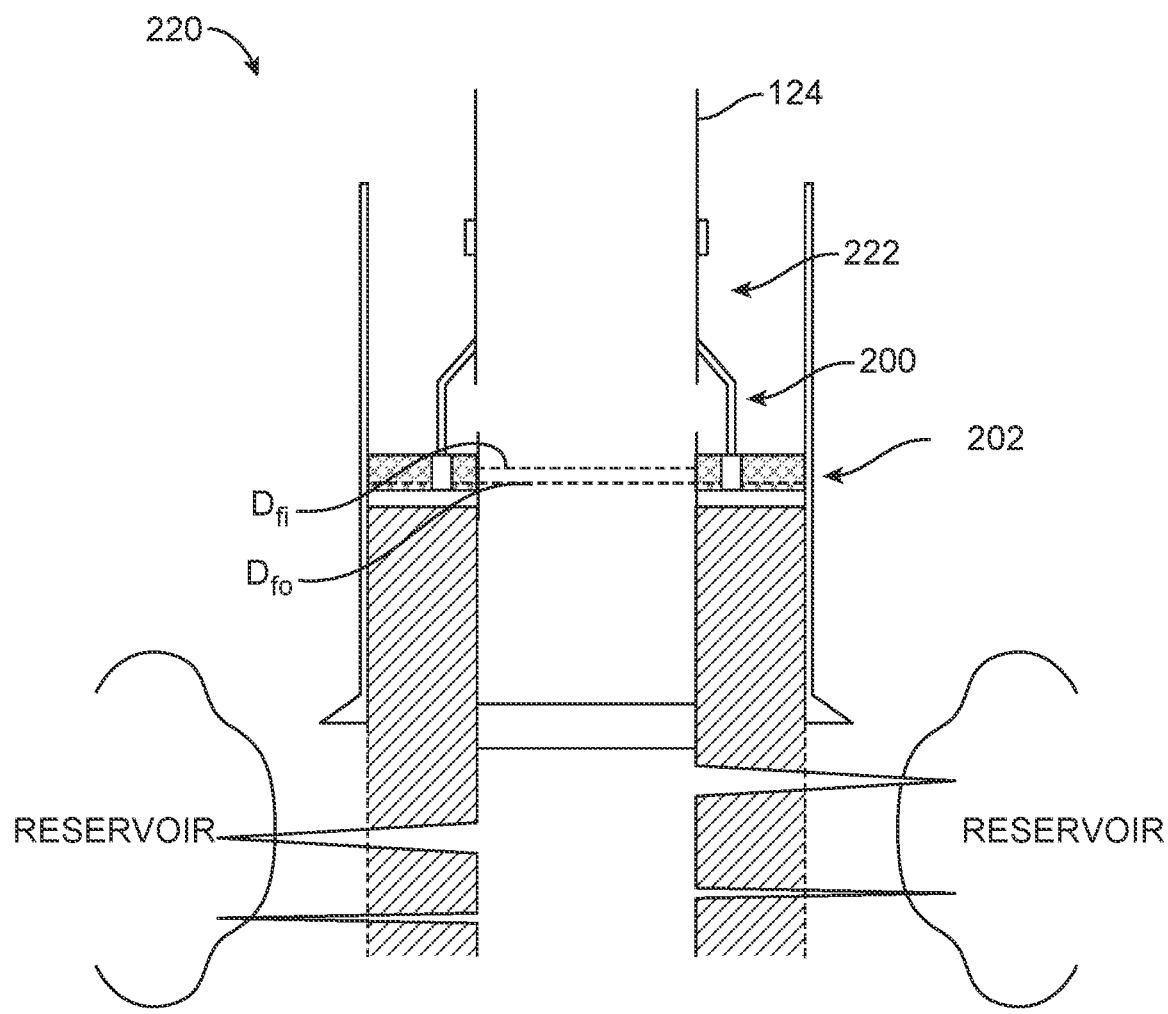

FIGS. 7A and 7B are cross sectional side views of a wellbore system 220 with a replacement assembly 222 having the sealing assembly 202 of the connection device 200, in the inactivated state and final state, respectively. The wellbore system 220 is substantially similar to the wellbore system 100, however, the wellbore system 220 includes the connection device 200 rather than the connection device 106. Additionally, the replacement assembly 222 is substantially similar to the replacement assembly 102, however, the replacement assembly 222 includes the connection device 200 rather than the connection device 106.

With the connection device 200, the replacement assembly 222 is configured to form two seals. The first expandable material 142 forms a first seal with the exterior 126 of the casing stub 110. The second expandable material 204 forms a second seal with the outer casing 116. Both the first and second seal have a pressure rating between 5,000 psi and 15,000 psi. The first and second expandable materials 142, 204 are the same expandable material. In some connection devices, the first and second expandable materials are different expandable materials. The movement of the first expandable material 142 shrinks an inner diameter of the of aperture 147 of the expandable material 142, whereas the movement of the second expandable material increases an outer diameter Dao of the second expandable material. In some cases, distance between the clearance between the inner face of the outer casing and the exterior surface of the casing stub is can be about or less than 2 inches to maintain the sealing pressure rating of the sealing assembly.

Additionally, the distance between the outer casing 116 and the outer surface 206 of the of the body 135 is greater than the distance between inner surface 139 of the body 135 and the exterior of the casing stub 110. As such, the second expandable material 204 expands further than the first expandable material 142 to contact a surface and form a seal. Where the expandable materials are the same, the second seal formed by the second expandable material 204 has a lower pressure rating than the first seal, formed by the first expandable material 142. The second seal can act as a backup seal should the first seal formed by the first expandable material 142 and the exterior 126 of the casing stub 110 fail. Additionally, the expansion of the second expandable material 204 may prevent radial deformation of the body 135 due to radial pressure from the first expandable material 142 in the activated or final state. Additionally, the second expandable material 204 may provide additional structure or an additional force towards the first axis 158 to the first expandable material 142, thereby improving the first seal.

In some connection devices, the sealing assembly includes only a first expandable material or a first expandable material adjacent a second expandable material. In such sealing assemblies, the expandable material connects to the body by a shell (e.g., structure, wall), rather than being directly welded to the inner surface 139 of the body 135.

Figure 8A:
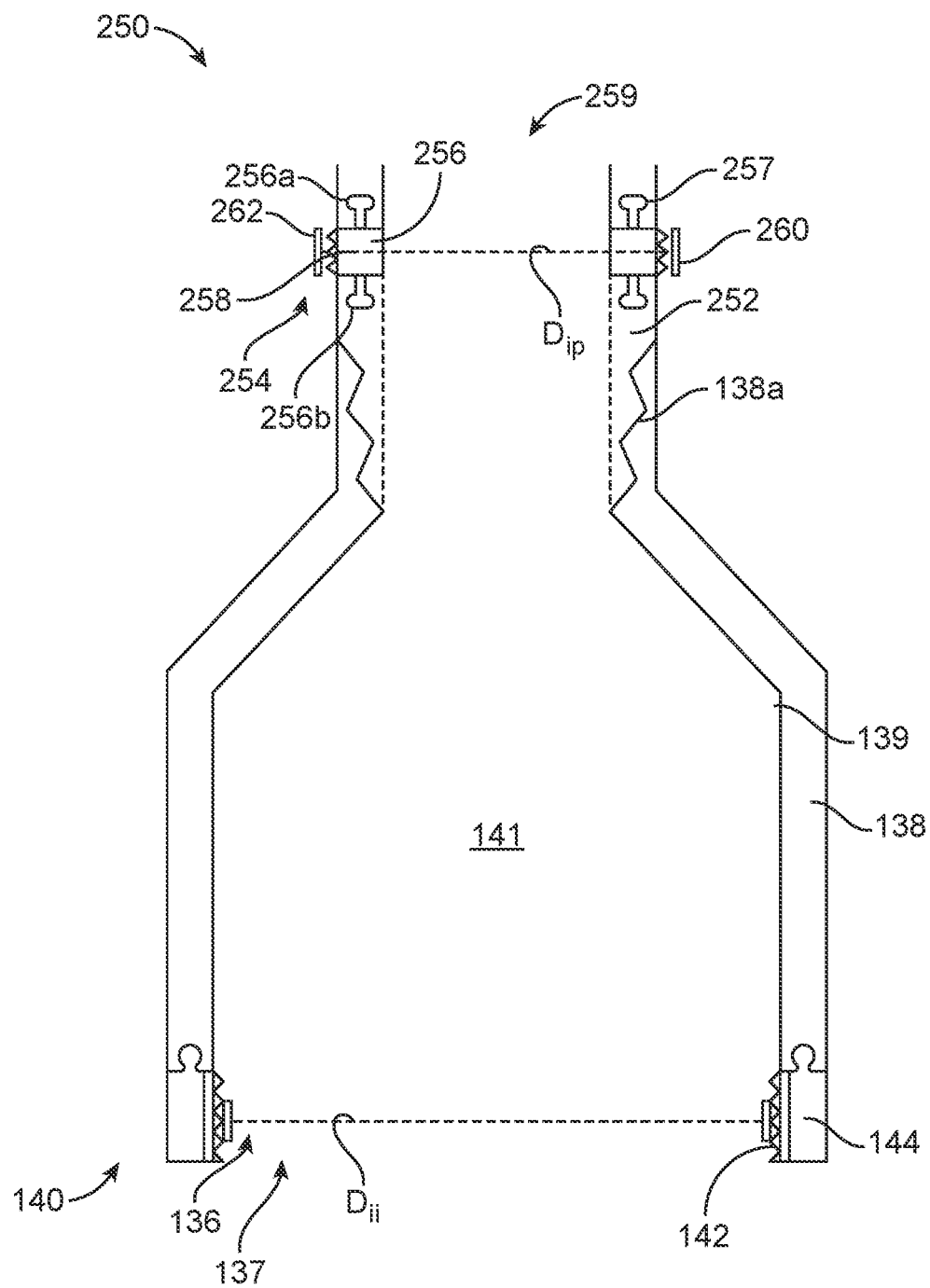
FIGS. 8A and 8B are cross sectional side views of a connection device having multiple sealing assemblies in an inactivated state and final state, respectively.
Figure 8B:
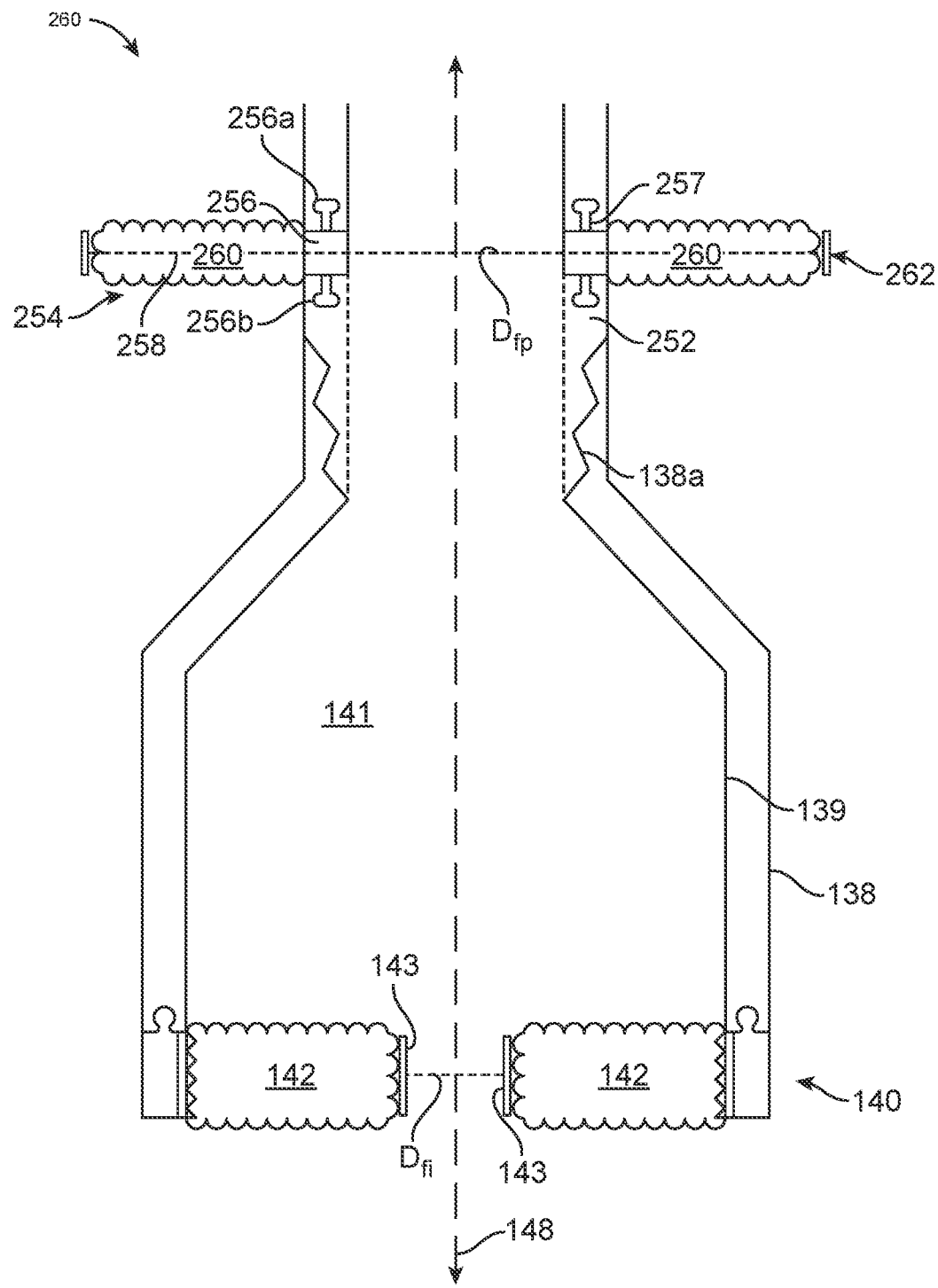

FIGS. 8A and 8B are cross sectional side views of a connection device 250 having multiple sealing assemblies in an inactivated state and final state, respectively. The connection device 250 is substantially similar to the connection device 106 described with reference to FIGS. 1-4E, however, the connection device 250 includes a second sealing assembly 254 and a pup joint 252 for providing an annular seal in the annular volume. Some devices and/or assemblies include casing joints and/or pup joints arranged between the second sealing assembly and the body. connection device 250 includes a first sealing assembly substantially similar to the sealing assembly 141 described with reference to FIGS. 1-4E. The first sealing assembly 141 is mounted, attached, or mechanically connected to a distal end of a body 135 and forms a seal with the casing stub 110 in an activated state.

Additionally, the connection device 250 has a casing connection surface 157 defined by the second sealing assembly 254. In a connection device 106, a casing connects to the connection surface 138a of the body 135 at the first end 134 of the connection device 106 whereas, in a connection device 250, a casing connects to the casing connection surface 257 of the second sealing assembly 254 at the first end 259 of the connection device 250.

The connection device 250 also includes a body substantially similar to the body 135. The body 135 of the connection device 250 has a smooth inner surface 140 and a connection surface 138a. The connection surface 138a is configured to connect to a pup joint 252 of the connection device 250. The pup joint 252 is disposed in the connection device 250 between the body 135 and a second sealing assembly 254. The second sealing assembly 254 has a second shell 256 with a proximal attachment end 256a configured to attach to a replacement casing, and a distal attachment 256b configured to attach to the pup joint 252. In some cases, the second sealing assembly connects directly to an outer surface of the pup joint rather than connected to the pup joint by a shell. In such a case, the second sealing assembly is substantially similar to the first sealing sub assembly 140, however, the second expandable material of the second sealing assembly expands towards the casing rather than the axis 148 The second shell 256 also defines an external face 258 on which a second expandable material 260 is mounted The second expandable material is substantially similar to the second expandable material 204 described with reference to FIGS. 6A-7B, however, the second expandable material is disposed on the second shell 256 in a second sealing assembly for sealing an annular space in the annular volume 122. Additionally, the second expandable material 260 is arranged at a different axial location or wellbore depth than the second expandable material 204. In some connection devices, the second sealing assembly may be a packer with swellable material (second expandable material).

The second expandable material 260 has a second (outer) expansion face 262. The expansion face 262 moves as the second expandable material 260 expands in the presence of an activation liquid. The second expansion face 262 extends away from the external face 258 of the shell 256. In this configuration, the second expansion face 262 defines an outer diameter of the second expandable material. The outer diameter of the second expandable material 260 has an inactivated outer diameter Dip (FIGS. 8A, 9A), an activated outer diameter Dap, and a final outer diameter $D_{fp}$ (FIGS. 8B, 9B), corresponding to the state of the second sealing assembly 254.

The second sealing assembly may transition from the various states at different times than the first sealing assembly based on the type of activation fluid, expandable materials, and wellbore structure in the system. In some sealing assemblies, the first expandable material and the second expandable material are the same material. In some sealing assemblies, the first expandable material and the second expandable material are different expandable materials. In some sealing assemblies, the first expandable material is activated by a first activation fluid and the second expandable material is activated by a second activation fluid. The first activation fluid may be the same activation fluid, a modified first activation fluid (e.g., the same fluid at a different concentration), or a different activation fluid. The first and/or second activation fluid may be an oil-based activation fluid or a water-based activation fluid.

Figure 9A:
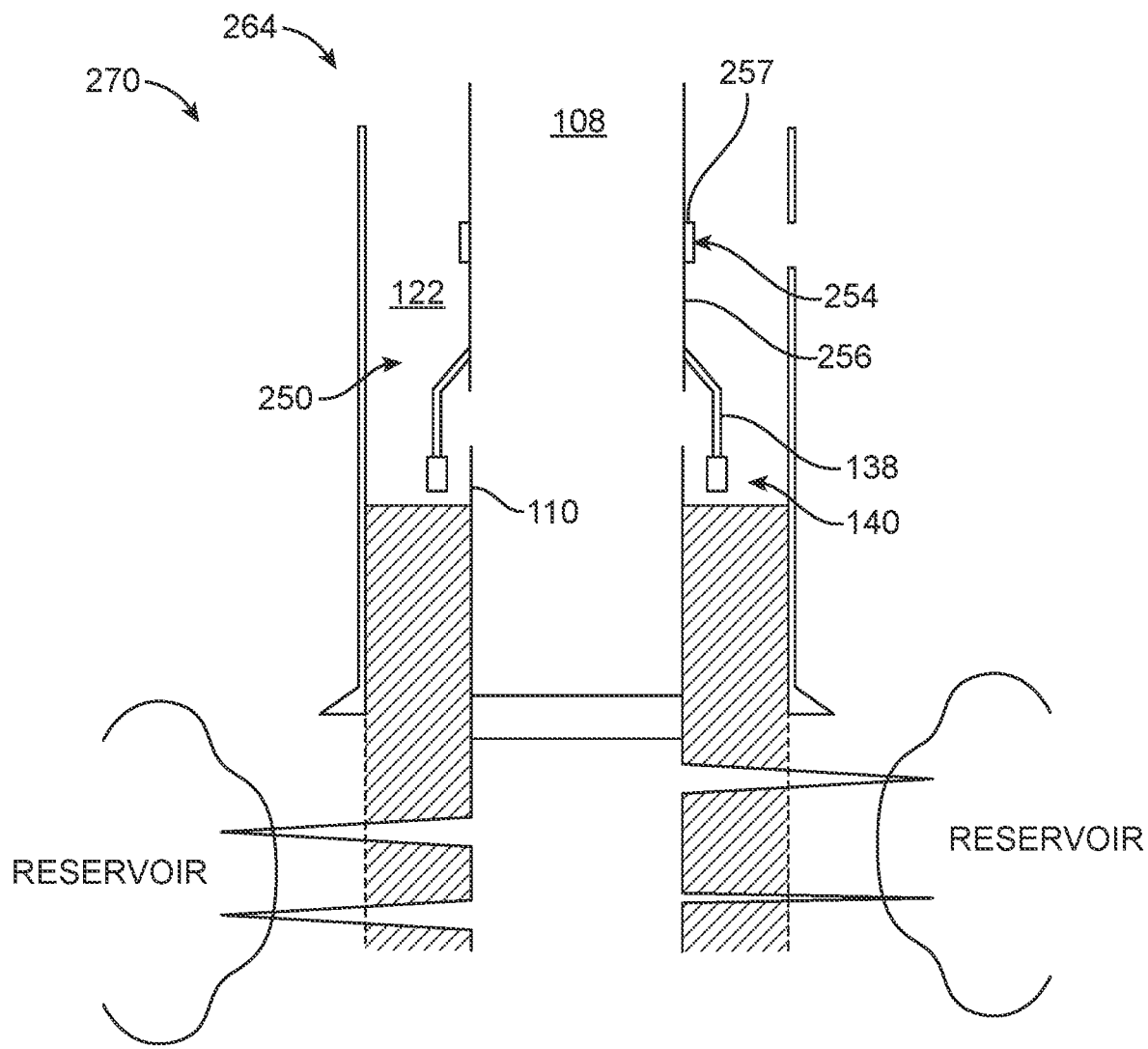
FIGS. 9A and 9B are cross sectional side views of a wellbore system having the connection device of FIG. 10A with the multiple sealing assemblies in the inactivated state and final state, respectively.
Figure 9B:
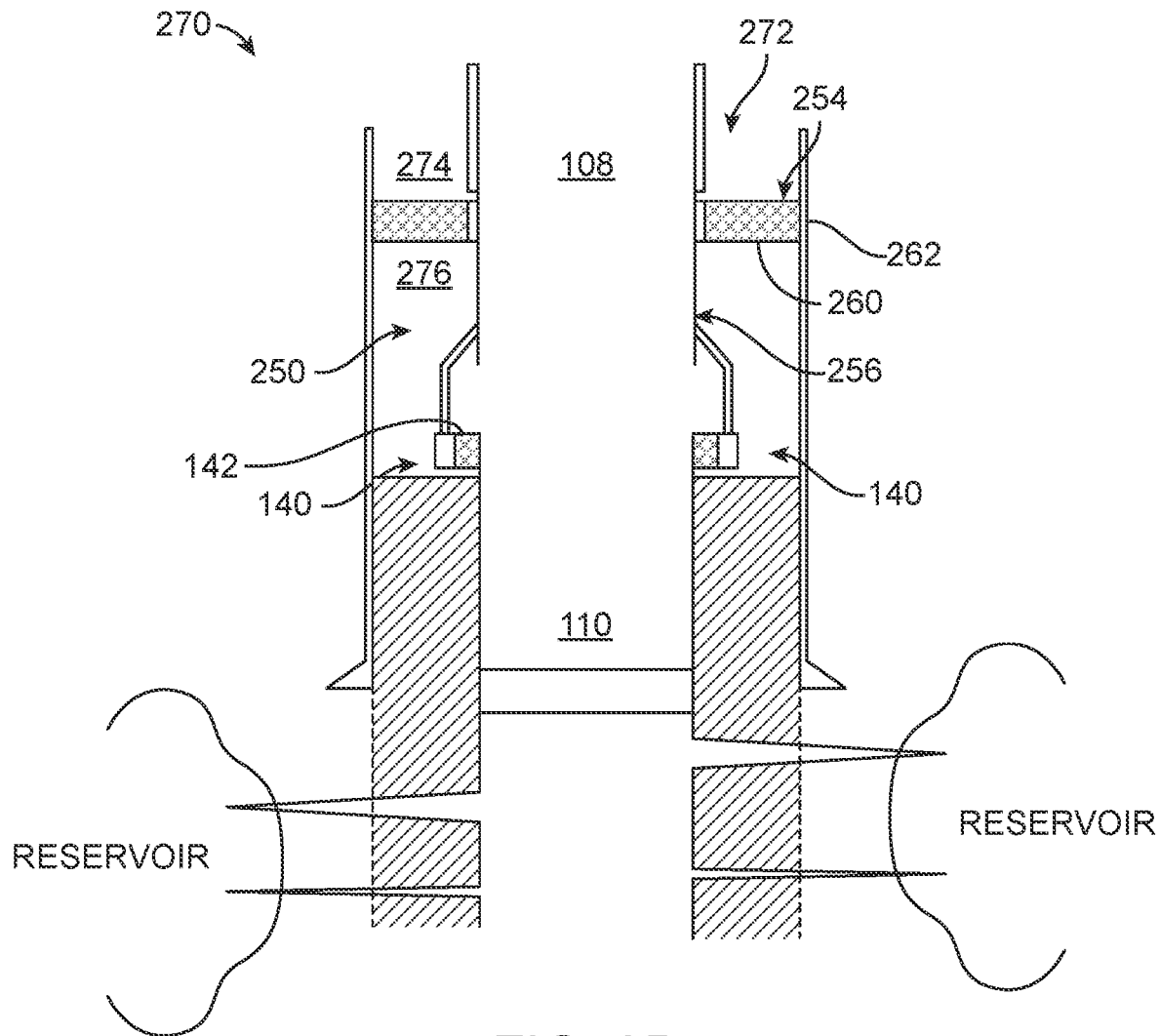

FIGS. 9A and 9B are cross sectional side views of a wellbore system 270 with the multiple sealing assemblies in the inactivated state and final state, respectively. The wellbore system 270 is substantially similar to wellbore system 100 and/or wellbore system 220, however, the wellbore system 270 includes a replacement assembly 272 having a connection device 250 with a first sealing assembly 141 and a second sealing assembly 254. The replacement assembly 272 is substantially similar to the replacement assembly 102, however, the replacement assembly 272 includes the connection device 250 and the inner casing 108 connects to a second sealing assembly 254 rather than directly to the body 135.

With the connection device 250, the replacement assembly 272 is configured to form two seals. The first sealing assembly 141 forms a first seal with the exterior 126 of the casing stub 110. The second sealing assembly 254 forms a second seal with the outer casing 116 uphole from the body 135 and first sealing assembly 141. Both the first and second sealing assemblies form seals having a pressure rating between 5,000 psi and 15,000 psi. The first and second expandable materials 142, 260 are the same expandable material. In some connection devices, the first and second expandable materials are different expandable materials. The movement of the first expandable material 142 shrinks an inner diameter of the of the second opening 137 whereas the movement of the second expandable material increases an outer diameter Dip, $D_{ap}$, $D_{fp}$ of the second expandable material 260

Additionally, the distance between the outer casing 116 and the external face 258 of the second shell 256 is greater than the distance between the first side of the (first) shell and the exterior 126 of the casing stub 110. As such, the second expandable material 260 expands further than the first expandable material 142 to contact a surface and form a seal. Where the expandable materials are the same, the second seal formed by the second expandable material 260 has a lower pressure rating than the first seal, formed by the first expandable material 142. The second seal can act as a backup seal should the first seal formed by the first expandable material 142 and the exterior 126 of the casing stub 110, fail. Additionally, second sealing assembly 254 can provide structural support for the replacement assembly and isolate the first sealing assembly from harmful fluids. In the final state, the second sealing assembly separates the annular volume into an uphole (first annular volume 274 and a second (downhole) annular volume 276. The second expandable material 260 forms a fluidic seal, isolating fluids in the uphole annular volume 274 from fluids in the downhole annular volume 276. The second expandable material 260 forms a pressure seal, isolating pressures in the uphole annular volume 274 from pressures in the downhole annular volume 276.

Figure 10A:
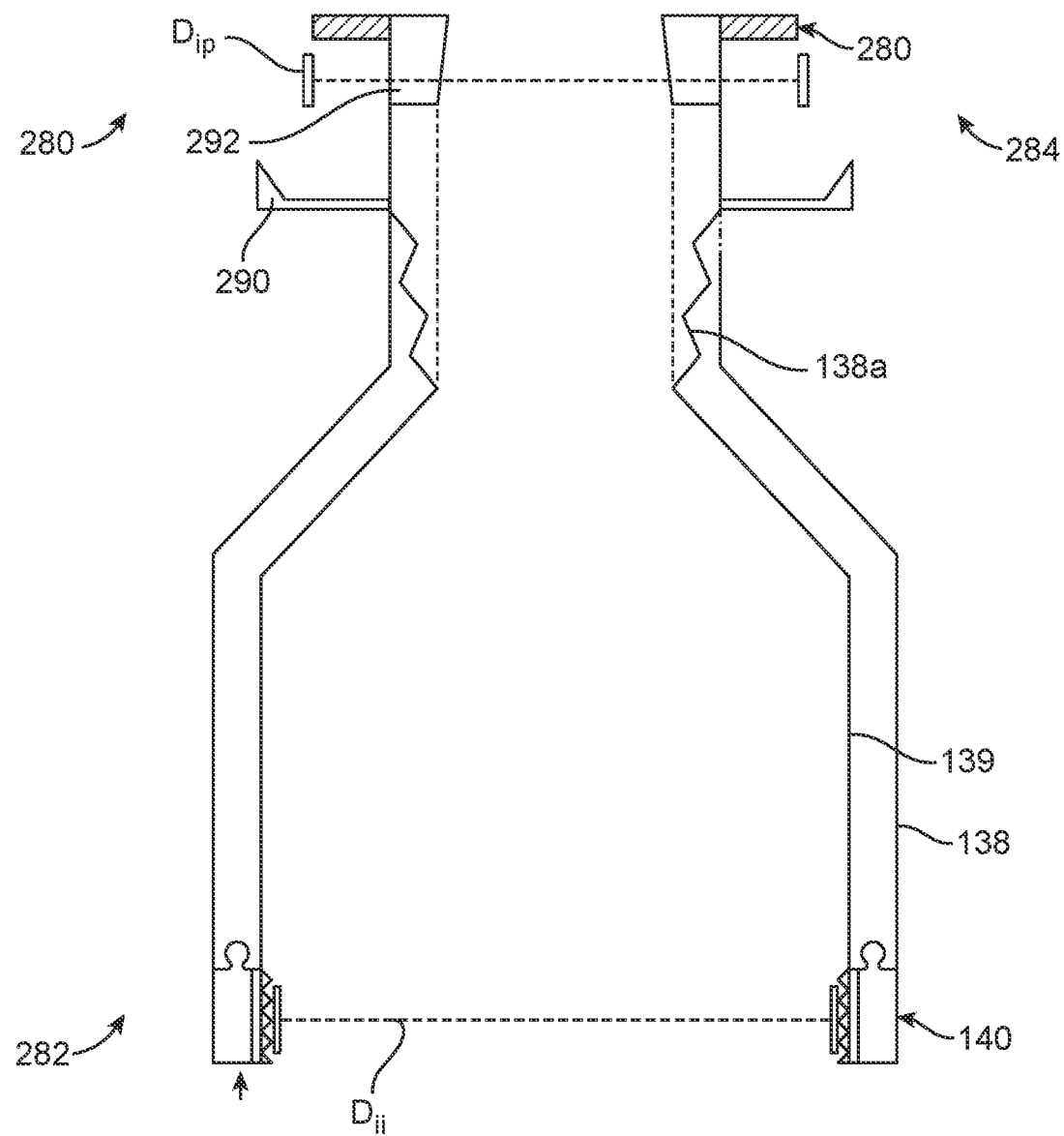
FIGS. 10A and 10B are cross sectional side views of a connection device with a first sealing assembly of a guidance sub-system, and a second sealing assembly of a hanger sub-system in an inactivated and a final state, respectively.
Figure 10B:
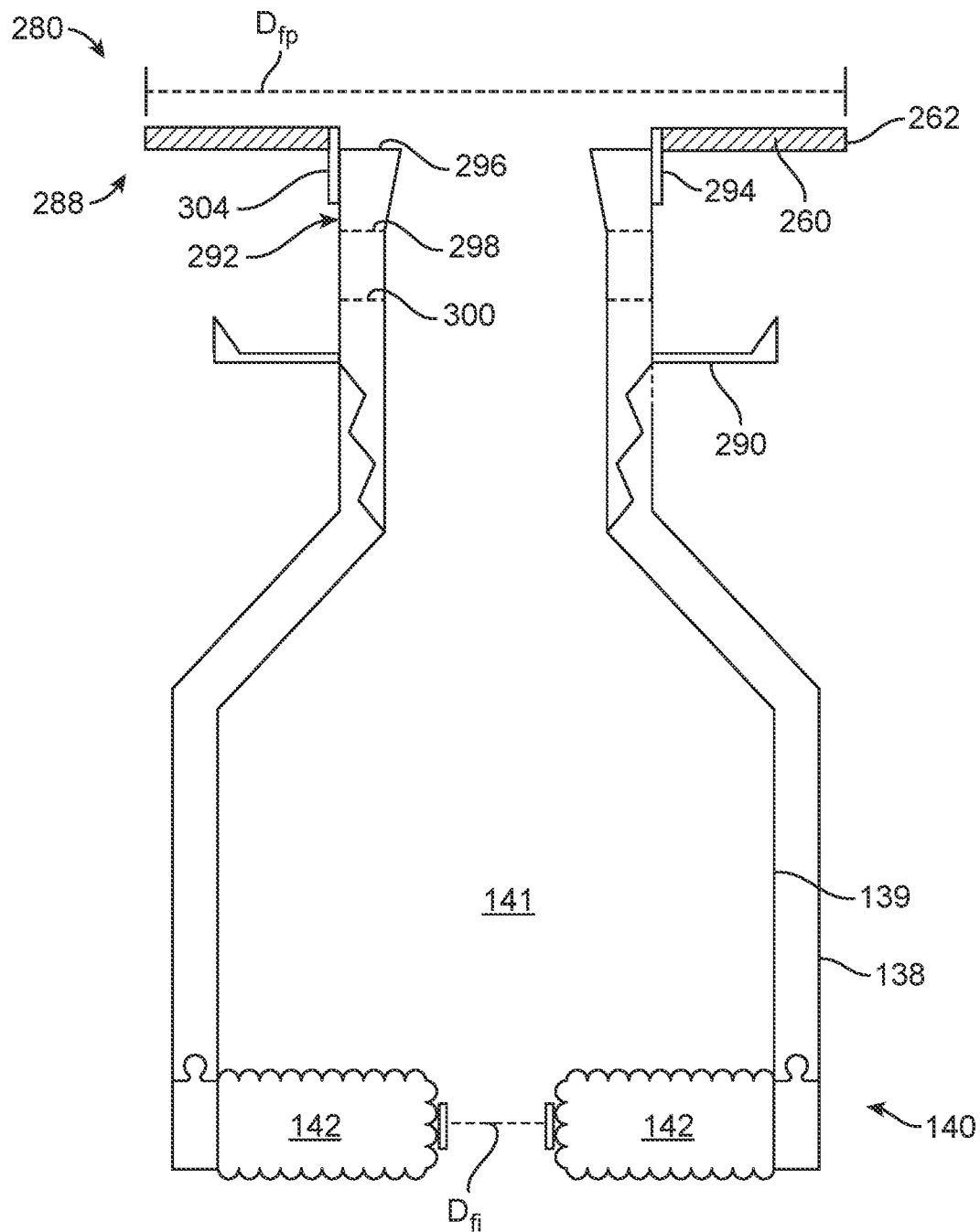

FIGS. 10A and 10B are cross sectional side views of a connection device 280 with a guidance (mounting) subsystem 282, and hanger sub-system 284, each having sealing assemblies in an inactivated and a final state, respectively. The connection device 280 is a dual-run connection device. The guidance sub-system 282 is substantially similar to the connection device 106, however, the guidance sub-system 282 is configured to connect or engage the hanger sub-system 284 at the connection surface 138a of the body 135 rather than connecting the connection surface 138a directly to a casing.

The guidance sub-system 282 includes the body 135 and the (first) sealing assembly 141. The first sealing assembly is substantially similar to the sealing assembly 141 described with reference to FIGS. 1-4E. The body 135 is substantially similar to the body 135 of the connection device 106, described with reference to FIGS. 1-4E. The first sealing assembly includes the expandable material 142 for sealing the connection device 280 to a casing stub or lower completion string. The guidance sub-system is configured to receive, guide, and mount to a casing stub 110 or lower completion tubing. as described with reference to FIGS. 1-4E. Further, the guidance sub-system 282 is configured to fix or mount the hanger sub-system 284 to the casing stub 110 or lower completion tubing. As described previously, the body may be formed by or comprise an inverted polished bore receptacle or an inverted polished bore housing.

The hanger sub-system 284 includes a second sealing assembly 288, a hanger (hanger tool, hanger device) 290, and a polished bore receptacle 292. The second sealing assembly is substantially similar to the second sealing assembly 254 of the connection device 250, however, the second sealing assembly 288 is part of a hanger sub-system 284 and includes a packer housing 294 rather than a shell 256. In some devices, the second sealing assembly is a production packer. The second sealing assembly 288 is arranged adjacent to a first (uphole) end 296 of the polished bore receptacle 292 and is sized to receive a sealing arrangement of a casing. The polished bore receptacle 292 has a receiving chamber 298 arranged in the first end 296 and sized to receive a casing or casing seal arrangement. Together, the receiving chamber of the polished bore receptacle 292 and the second sealing assembly 288 form a casing contact surface 319 configured to receive an inner casing or a sealing arrangement of an inner casing. When connected to a casing, the second sealing assembly 288 forms a seal between the casing and the second sealing assembly 288. Additionally, the receiving chamber 298 of the polished bore receptacle 292 also forms a seal with the casing. The polished bore receptacle 292 extends from the first end 296 to a second (downhole) end 300. The second end 300 of the polished bore receptacle 292 attaches to the hanger 290. The hanger 290 attaches to the connection surface 138a of the body 135 of the guidance sub-system 282.

When mounted, the hanger sub-system 284 can perform completion operations, for example, to finish an upper completion string in an upper/lower completion system. Additionally, the hanger sub-system provides a releasable, sealed connection between a replacement casing and a second sealing assembly 288

The first sealing assembly 141 has an inactivated state, activated state, and final state, described in detail with reference to FIGS. 3A-4E. The second sealing assembly 288 is a hydraulic set packer 290. The packer 290 is set by pressuring up against a tubing plug in the short string beneath the packer 290 which is ported to a piston chamber. Hydraulic pressure enters the piston chamber creating an upwards force which shears the setting shear pins and drives a cylinder downwards and the piston upwards. The piston strokes up to energize a seal element against the casing while the cylinder strokes down to set slips. The seal elements create an annular seal and teeth of the slips bite into the casing wall holding the packer in place. When setting pressure is bled off, a lock ring holds the packer set. The packer 290 is made from rubber elastomer, with a rating of 80-90 durometer. Unlike the first sealing assembly, the hydraulic set packer 290 does not have an inverse relationship between the expansion distance and sealing pressure (e.g., sealing rating). Instead, the pressure rating of the hydraulic set packer 290 is maintained even after the packer 290 expands to cover the full distance (clearance) from the connection device to the casing 116.

In some connection devices, the second sealing assembly may be a packer with swellable material (second expandable material), a production packer, and/or a hanger packer. In some systems, the second sealing assembly is a swellable sealing assembly, substantially similar to sealing assembly 260, described with reference to FIG. 8A-8B. In such a system, the second sealing assembly has an inactivated state, activated state, and inactivated state. The second sealing assembly 288 includes the second expandable material that is substantially similar to the second expandable material 260 described with reference to FIGS. 8A-9B. The second sealing assembly is configured to seal an annular space in the annular volume.

The second expandable material has a second (outer) expansion face. The expansion face moves as the second expandable material expands in the presence of an activation liquid. The second expansion face extends away from an external face of the packer housing. In this configuration, the second expansion face defines an outer diameter of the second expandable material. The outer diameter of the second expandable material has an inactivated outer diameter $D_{ip}$ (FIGS. 10A, 11A), an activated outer diameter $D_{ap}$, and a final outer diameter $D_{fp}$ (FIGS. 10B, 11B), corresponding to the state of the second sealing assembly.

The second sealing assembly may transition from the various states at different times than the first sealing assembly based on the type of activation fluid, expandable materials, and wellbore structure in the system. In some sealing assemblies, the first expandable material and the second expandable material are the same material. In some sealing assemblies, the first expandable material and the second expandable material are different expandable materials. In some sealing assemblies, the first expandable material is activated by a first activation fluid and the second expandable material is activated by a second activation fluid. The first activation fluid may be the same activation fluid, a modified first activation fluid (e.g., the same fluid at a different concentration), or a different activation fluid. The first and/or second activation fluid may be an oil-based activation fluid or a water-based activation fluid.

FIG. 11A is cross sectional side view of a wellbore system 310 having a dual-run assembly 312 with the connection device 280, during a first run insertion. The wellbore sub-system 310 is substantially similar to the wellbore system 100, however, the wellbore system 310 includes a connection device 280 with a guidance sub-system 282 connected to a hanger sub-system 284. As such, the wellbore system 310 is configured to both mount the connection device 280 onto the casing stub 110 and operate the hanger sub-system 284 prior to replacing an inner casing 108.

The mounting stages of operation for the wellbore mirror the stages and methods described with reference to FIGS. 4A-4E. However, rather than mounting a casing 108 via the replacement assembly 102, the connection device 280 mounts a hanger sub-system 284 using a drill string 314. The first sealing assembly 141 and the second sealing assembly 288 are inserted and aligned with the casing stub 110 in the inactivated state. Additionally, the connection device 280 has aligned with the casing stub 110 as described with reference to FIGS. 4A-E. The first and second sealing assemblies are activated and form seals between the first sealing assembly and the casing stub 110 and the second sealing assembly 288 and the outer casing 116.

Figure 11B:
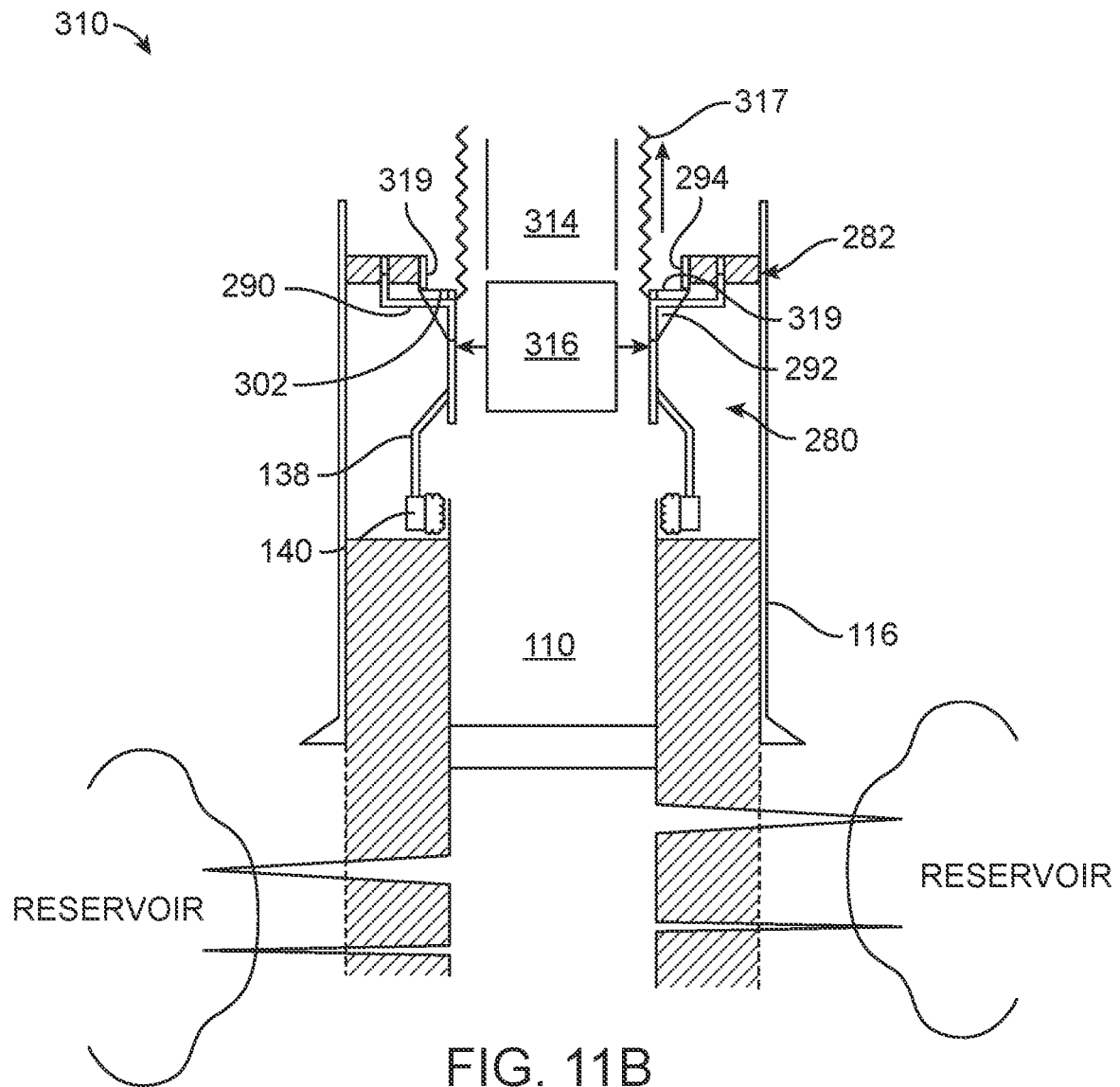
FIG. 11B is a cross sectional side view of the wellbore system of FIG. 11A during removal of drill string tools.

FIG. 11B is a cross sectional side view of the wellbore system with the connection device 280 sealed to the casing stub 110 and outer casing 116. After activation of the first and second sealing assemblies 140, 288, the first and second sealing assemblies arrive at the final states, respectively. At this stage, the second opening 137 has a final inner diameter $D_{fi}$ and the second expandable material has a final outer diameter $D_{fop}$. Setting tools 316 are mounted on the drill string to set the hanger 290 at a predetermined depth in the wellbore 104. Additionally, the setting tools 316 can run and pressurize a liner 317 connected to the hanger 290. After setting, the pressure is bled off, and the setting (running) tools 316 can be released. The setting tools 316 are removed from the wellbore 1020 with the drill string 314. At this stage, the wellbore system 310 is prepped for a new upper casing (e.g., production tubing or replacement casing).

Figure 11C:
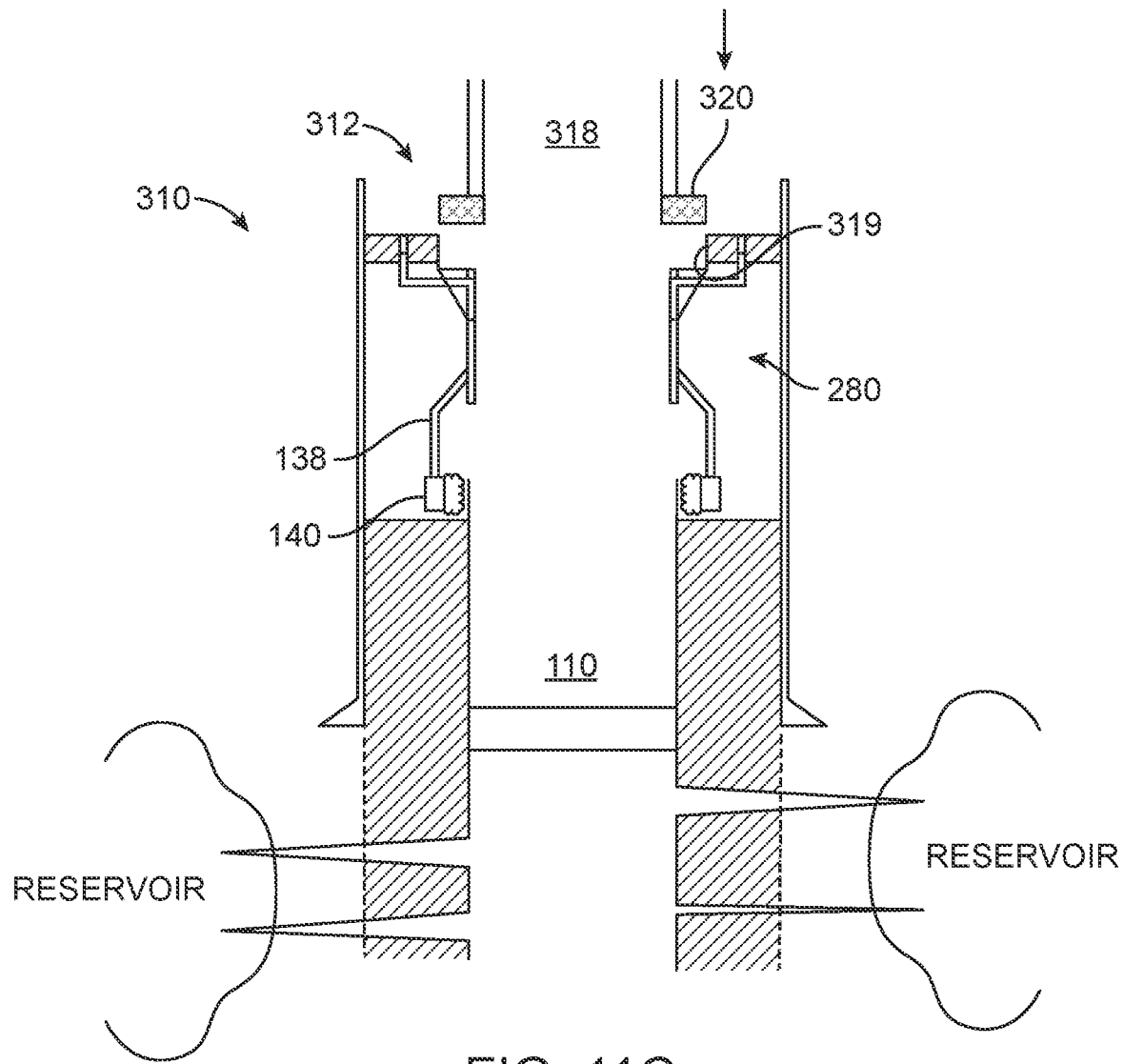
FIG. 11C is a cross sectional side view of the wellbore system of FIG. 11A during a second run insertion of a casing of an assembly.

FIG. 11C is a cross sectional side view of the wellbore system 310 during a second run insertion of an upper casing 318. The upper casing 318 includes a seal arrangement 320 capable of forming a sealed connection with the second sealing assembly 288 and the receiving chamber 302 of the polished bore receptacle 292. The new casing is inserted in a second run, with the seal arrangement 320 entering first. The seal arrangement 320 are aligned with the receiving chamber 302 of the polished bore receptacle 292 and the second sealing assembly 288.

Figure 11D:
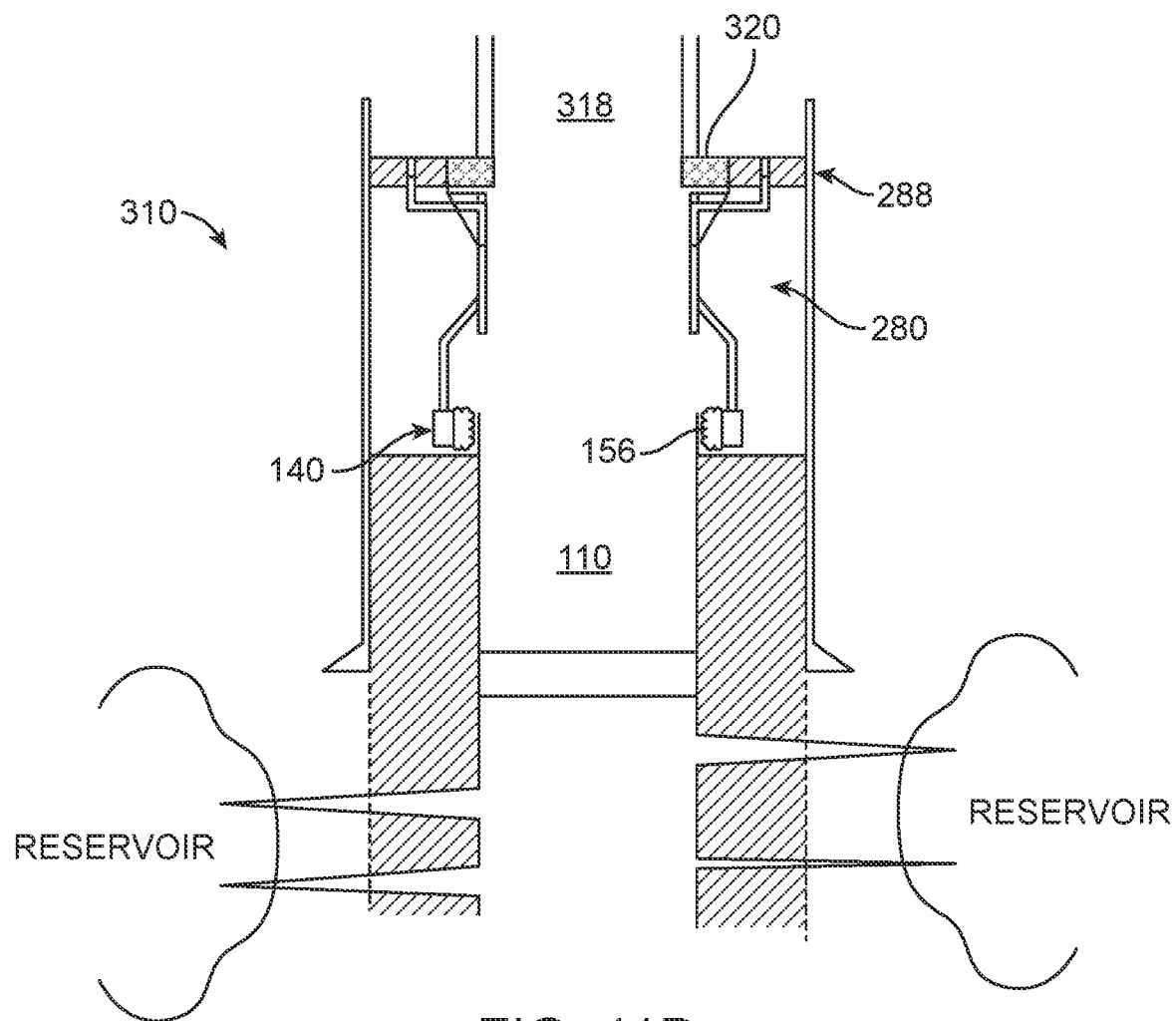
FIG. 11D is a cross section side view of the wellbore system of FIG. 11A with a seal of the replacement casing stung into an annular seal bore of the connection device.

FIG. 11D is a cross sectional side view of the wellbore system 310 with the casing 318 fully engaged and sealed to the connection device 280. The seal arrangement 320 are stung-in the receiving chamber 302 of the polished seal bore receptacle 292 and into the second sealing assembly 288. in the hanger sub-system 284. The casing is landed by surface tools, for example a tubing hanger in a tubing spool. After the swell-able packer is fully expanded, perform the required pressure tests in the tubing and the tubing-casing annulus.

A number of embodiments have been described. Nevertheless, it will be understood that various modifications may be made. Accordingly, other embodiments are within the scope of the following claims.

What is claimed is:

1. A connection device comprising:
a body extending from an open first end of the connection device, the body comprising:
a smooth inner surface, wherein the inner surface at least partially defines an interior volume of the connection device, wherein the inner surface of the body is at least partially formed by a material treated by a nitrating gas treatment, and
a connection surface defining a first opening at the open first end of the connection device,
a sealing assembly extending from a second open end of the connection device, the sealing assembly comprising:
a cylindrical shell centered on an axis, the cylindrical shell having a first side facing the axis, and
a cylindrical, expandable material mounted on the first side of the cylindrical shell, wherein the expandable material is configured to expand radially towards the axis.

2. The connection device according to claim 1, wherein the expandable material has an expansion face oriented towards the axis, wherein the expansion face defines an opening in the second open end of the connection device.

3. The connection device according to claim 2, wherein the opening in the second open end has an inner diameter, wherein the inner diameter is greater than a diameter of the first opening defined by the connection surface of the body.

4. The connection device according to claim 2, wherein the expansion face is configured to contact a surface and form a seal with the surface, wherein the seal has a pressure rating between 5000 psi and 15000 psi.

5. The connection device according to claim 1, wherein the body is an inverted polished bore housing.

6. The connection device according to claim 1, further comprising a hanger sub-system attached to the connection surface of the body.

7. The connection device according to claim 6, wherein the hanger sub-system comprises:
a hanger,
a second sealing assembly connected to the hanger, and
a polished bore receptacle having a receiving chamber arranged between the second sealing assembly and the hanger.

8. The connection device according to claim 7, wherein the second sealing assembly and the receiving chamber of the polished bore receptable define a casing contact surface.

9. The connection device according to claim 7, wherein the body is an inverted polished bore housing.

10. A replacement assembly comprising:
a connection device comprising:
an inverted polished bore housing extends from an open first end of the connection device, the inverted polished bore housing comprising:
a connection surface defining a first opening at the open first end of the connection device, and
a smooth inner surface, wherein the inner surface of the body is at least partially formed by a material treated by a nitrating gas treatment, and
a sealing assembly arranged a second open end of the connection device, the sealing assembly comprising:
an expandable material connected to the inverted polished bore housing and configured to expand in the presence of an activation fluid; and
an inner casing connected to the inverted polished bore housing at the connection surface of the inverted polished bore housing.

11. The replacement assembly according to claim 10, wherein the inner casing has an inner diameter, wherein the expandable material has an expansion face defining an opening in the second end of the connection device.

12. The replacement assembly according to claim 10, wherein the connection surface of the inverted polished bore housing has an inner diameter equal to or greater than the inner casing.

13. The replacement assembly according to claim 10, wherein the connection surface of the inverted polished bore housing forms a first opening, and the sealing assembly forms a second opening.

14. The replacement assembly according to claim 13, wherein the smooth inner surface at least partially defines an interior volume of the connection device.

15. The replacement assembly according to claim 14, wherein the interior volume of the connection device extends from the first opening to the second opening and wherein the interior volume of the connection device is in fluid connection with the inner casing.

16. The replacement assembly according to claim 14, wherein the sealing assembly is configured to isolate the interior volume of the connection device.

17. The replacement assembly according to claim 16, wherein the replacement assembly is configured to connect with a casing stub disposed in a wellbore.

18. The replacement assembly according to claim 10, further comprising a hanger sub-assembly fixed to the connection surface of the inverted polished bore housing.

19. A method comprising:
inserting a replacement assembly having a connection device with a sealing assembly on an end of the connection device, into a wellbore, wherein the connection device comprises a body, wherein an inner surface of the body is at least partially formed by a material treated by a nitrating gas treatment;

aligning the sealing assembly with a casing stub projecting from a cement slab, and flowing an activation fluid in the wellbore to activate the sealing assembly, wherein the activated sealing assembly forms a seal between the sealing assembly and the casing stub.

20. The method according to claim 19, further comprising pressure testing the seal formed by the sealing assembly.

21. The method according to claim 20, further comprising, prior to inserting the replacement assembly:

detecting a damaged portion of a string casing;

separating the damaged portion of the string casing from the casing stub; and removing the damaged portion of the string casing from the wellbore.

22. The method according to claim 21, wherein flowing the activation fluid in the wellbore to activate the sealing assembly comprises flowing the activation fluid in an inner casing or in an outer casing such that the activation fluid contacts an expandable material of the sealing assembly.

23. The method according to claim 19, further comprising, prior to inserting the replacement assembly, milling the casing stub to form a flat rim.

* * * * *